(12) United States Patent
Choi et al.

(10) Patent No.: US 8,053,854 B2
(45) Date of Patent: Nov. 8, 2011

(54) MICRO-HEATER ARRAYS AND PN-JUNCTION DEVICES HAVING MICRO-HEATER ARRAYS, AND METHODS FOR FABRICATING THE SAME

(75) Inventors: Junhee Choi, Seongnam-si (KR); Sung Soo Park, Seongnam-si (KR); Andrei Zoulkarneev, Suwon-si (KR); Jai Yong Han, Suwon-si (KR); Deuk Seok Chung, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 335 days.

(21) Appl. No.: 12/232,711

(22) Filed: Sep. 23, 2008

(65) Prior Publication Data
US 2009/0243040 A1   Oct. 1, 2009

(30) Foreign Application Priority Data
Mar. 25, 2008   (KR) .................. 10-2008-0027233

(51) Int. Cl.
*H01L 31/024* (2006.01)

(52) U.S. Cl. ............. 257/431; 257/E31.131; 136/246
(58) Field of Classification Search .............. None
See application file for complete search history.

(56) References Cited

U.S. PATENT DOCUMENTS

| | | | |
|---|---|---|---|
| 6,896,780 B2 * | 5/2005 | Yang et al. | 204/408 |
| 2009/0223557 A1 * | 9/2009 | Park et al. | 136/255 |
| 2009/0250112 A1 * | 10/2009 | Choi et al. | 136/259 |
| 2010/0187662 A1 * | 7/2010 | Choi et al. | 257/656 |
| 2010/0302337 A1 * | 12/2010 | Zhou et al. | 347/200 |

* cited by examiner

*Primary Examiner* — Benjamin Sandvik
(74) *Attorney, Agent, or Firm* — Harness, Dickey & Pierce, P.L.C.

(57) ABSTRACT

Example embodiments include micro-heater arrays including first and second micro-heaters disposed perpendicular to or parallel with each other on a substrate and methods of fabricating pn junctions between first and second heating portions using the heat generated from the first and second heating portions, respectively, when applying a voltage to the micro-heater array. Accordingly, when forming pn junctions using micro-heaters, a high-quality pn junction may be fabricated on a glass substrate over a large area.

31 Claims, 18 Drawing Sheets

MICRO-HEATER ARRAYS AND PN-JUNCTION DEVICES HAVING MICRO-HEATER ARRAYS, AND METHODS FOR FABRICATING THE SAME

PRIORITY STATEMENT

This application claims the benefit of priority under 35 U.S.C. §119 to Korean Patent Application No. 10-2008-0027233, filed on Mar. 25, 2008, in the Korean Intellectual Property Office, the entire contents of which are incorporated herein in their entirety by reference.

BACKGROUND

1. Field

Example embodiments relate to micro-heater arrays, methods for fabricating pn junctions using the same, and pn-junction devices having micro-heater arrays. Example embodiments also relate to micro-heater arrays including at least one first and second micro-heaters perpendicular to or parallel with each other on a substrate, and methods for fabricating pn junctions using a relatively high temperature generated by applying a voltage to the micro-heater arrays including at least one first and second micro-heaters perpendicular to or parallel with each other.

2. Discussion of the Related Art

Pn junctions are widely used for diodes that perform rectifying operations and also for opto-electronic devices, e.g., solar cells, light emitting diodes (LEDs) and image sensors. To fabricate solar cells including pn junctions, silicon (Si) is mainly used as a host material, and phosphorus (P) and boron (B) may be added as n-type and p-type doping materials, respectively. To fabricate LEDs, gallium nitride (GaN) is mainly used as a host material, and magnesium (Mg) and Si may be added as n-type and p-type doping materials, respectively.

To fabricate a high-quality pn junction with excellent thin-film characteristics such as high crystallinity, a relatively high temperature is generally required. A pn junction in which amorphous silicon is used as a host material may be fabricated at a growth temperature of about 300° C. However, a pn junction of single crystalline GaN, which may be used for an LED, may be fabricated at a growth temperature of about 1000° C. Due to the relatively high temperature, a glass substrate may soften and therefore the fabrication of pn junctions over a large area becomes difficult. Also, due to the relatively high temperature, a substrate on which the pn junction of single crystalline GaN may be formed may be limited to high-priced substrates, for example, silicon wafers, $Al_2O_3$, SiC, etc.

SUMMARY

Example embodiments are directed to micro-heater arrays and methods for fabricating pn junctions, which may result in high-quality pn junctions over a large area on a substrate, e.g., glass substrates, which are inexpensive and easily available.

Example embodiments include micro-heater arrays, including a substrate, at least one first micro-heater in parallel in a first direction on the substrate, and at least one second micro-heater in parallel in a second direction. Each of the at least one first micro-heater may include a first heating portion spaced apart from the substrate and extending in the first direction and first supports provided on the substrate to be spaced apart from one another and supporting the first heating portion. Each of the at least one second micro-heater may include a second heating portion extending in a second direction and second supports provided on the substrate to be spaced apart from one another and supporting the second heating portion. In the example embodiments, the first direction may be perpendicular to the second direction or the same as the second direction. If the first direction is perpendicular to the second direction, the at least one first micro-heater intersects the at least one second micro-heater. Example embodiments also provide that the spacing between the first heating portion and the substrate may be smaller than that between the second heating portion and the substrate, so that the first and second heating portions are spaced from each other at an intersection area thereof.

Example embodiments also provide that the second heating portion may include an opening at the intersection area of the first and second heating portions. Also, the second heating portion may include a transparent electrode. Example embodiments also include the at least first and second micro-heaters being driven independently.

Example embodiments provide the first supports may be partially disposed between the substrate and the first heating portion, and the second supports may be partially disposed between the substrate and the second heating portion, except at the intersection area of the first and second heating portions. Example embodiments also provide each of the first and second heating portions including first areas corresponding to contact areas (CA) and second areas between the first areas. The first areas may include the first and second heating portions contacting the first and second supports, respectively.

Example embodiments provide that the at least one first micro-heater may include first connecting portions extending from two sides of the first heating portion of the at least first micro-heater and arranged along a longitudinal direction of the first heating portion while being spaced apart from one another, respectively, except at the intersection area of the first and second heating portions. Example embodiments also provide that the at least one second micro-heater may include second connecting portions extending from two sides of the second heating portion and arranged along a longitudinal direction of the second heating portion while being spaced apart from one another, respectively, except at the intersection area of the first and second heating portions. The first supports may be provided between the substrate and the first connecting portions to support the first heating portion and the first connecting portions, and the second supports may be provided between the substrate and the second connecting portions to support the second heating portion and the second connecting portions. Example embodiments also provide for only the at least first micro-heater to have first connecting portions and/or the at least second micro-heater to have second connecting portions.

Example embodiments include methods for fabricating pn junctions using micro-heater arrays, including forming a pn junction between the first and second heating portions using the heat generated from the first and/or second heating portion when applying a voltage to the micro-heater array according to micro-heater array example embodiments. Example embodiments also provide methods including providing the micro-heater array in a chamber and applying a voltage to any one of the at least one first and second micro-heaters. A p-type material layer may be grown on the first and/or second heating portion by injecting a source gas and a p-type doping gas into the chamber and an n-type material layer may be grown on the p-type material layer by injecting a source gas and an n-type doping gas into the chamber.

Example embodiments further include where the first direction is perpendicular to the second direction and the at least one first micro-heater intersects the at least one second micro-heater. Example embodiments also include where the first direction is the same as the second direction and the at least first and second micro-heaters may be arranged in parallel and/or may alternate. If the method includes the first direction being the same as the second direction, a pn junction may include forming p-type and n-type material layers on the first and second heating portions, respectively.

Each of the p-type and n-type material layers may be a thin film and/or a nano-wire. Also a catalyst layer and/or a buffer layer may be formed on any one of the first and second heating portions. Example embodiments also provide methods for forming an $In_xGa_{1-x}N$ layer between the p-type and n-type material layers, and applying a voltage to one or more of the first and second heating portions to heat the p-type and/or n-type material layers. Also the substrate may be a glass substrate.

Example embodiments provide pn-junction devices including the micro-heater arrays and the pn junctions formed according to example embodiments.

BRIEF DESCRIPTION OF THE DRAWINGS

Example embodiments will be more clearly understood from the following detailed description taken in conjunction with the accompanying drawings. FIGS. 1-13 represent non-limiting, example embodiments as described herein.

FIG. 5 is a perspective view illustrating a pn junction formed between first and second heating portions using the micro-heater array according to example embodiments;

FIG. 6 is a view illustrating processes of forming a pn junction portion using the micro-heater array according to example embodiments, in which the micro-heater array illustrated in FIG. 1A is briefly shown for convenience of illustration;

FIG. 9 is a cross-sectional view taken along line III-III' of FIG. 6, illustrating forming a pn junction between first and second heating portions according to example embodiments;

FIG. 10 is a view illustrating a method of forming GaN pn-junctions through a halide vapor phase epitaxy (HVPE) process using the micro-heater arrays according to example embodiments;

FIG. 12 is a cross-sectional view taken along line II-II' of FIG. 5;

DETAILED DESCRIPTION OF EXAMPLE EMBODIMENTS

Figure 1A:
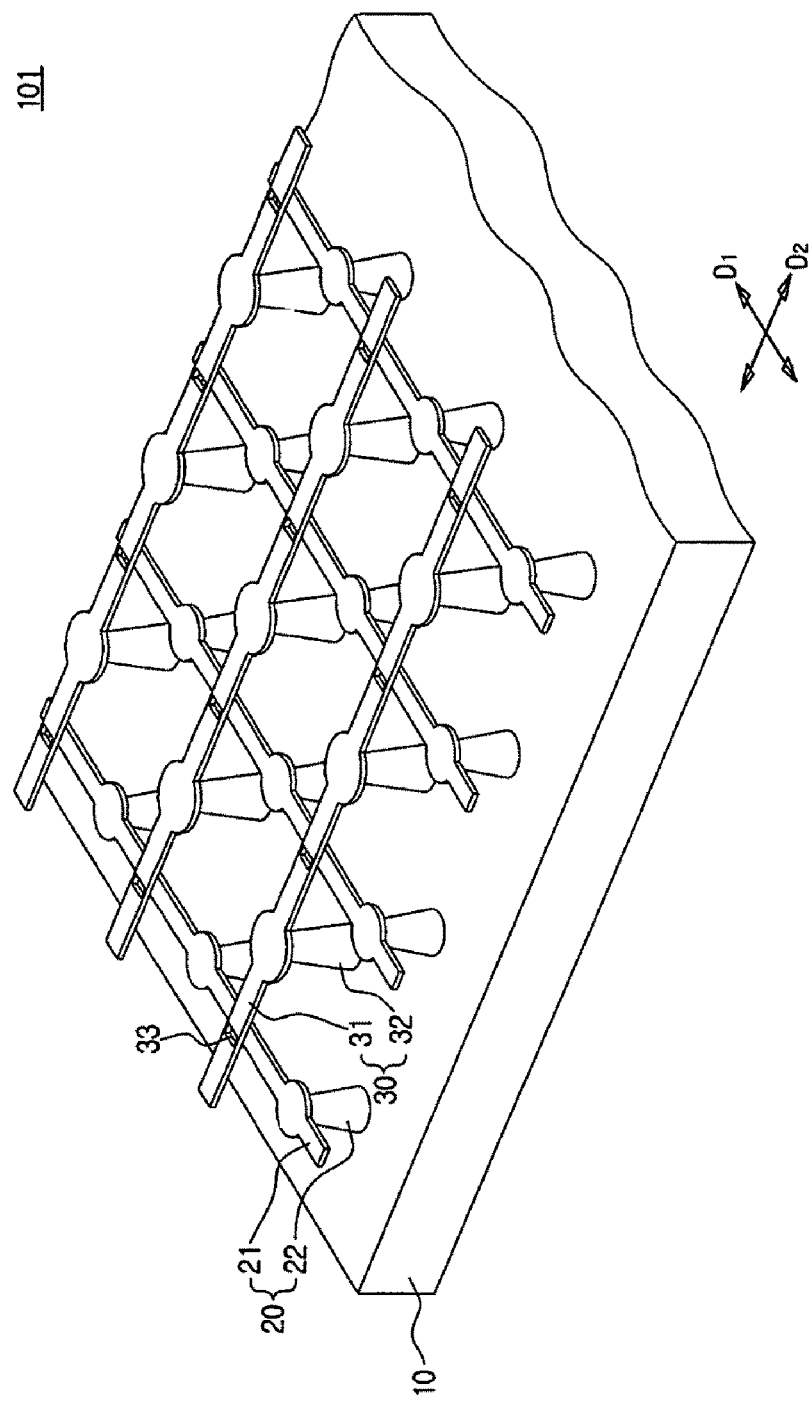
FIG. 1A is a perspective view of a micro-heater array according to example embodiments.

Various example embodiments will now be described more fully with reference to the accompanying drawings in which some example embodiments are illustrated. In the drawings, the thicknesses of layers and regions may be exaggerated for clarity.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, e.g., "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1B:
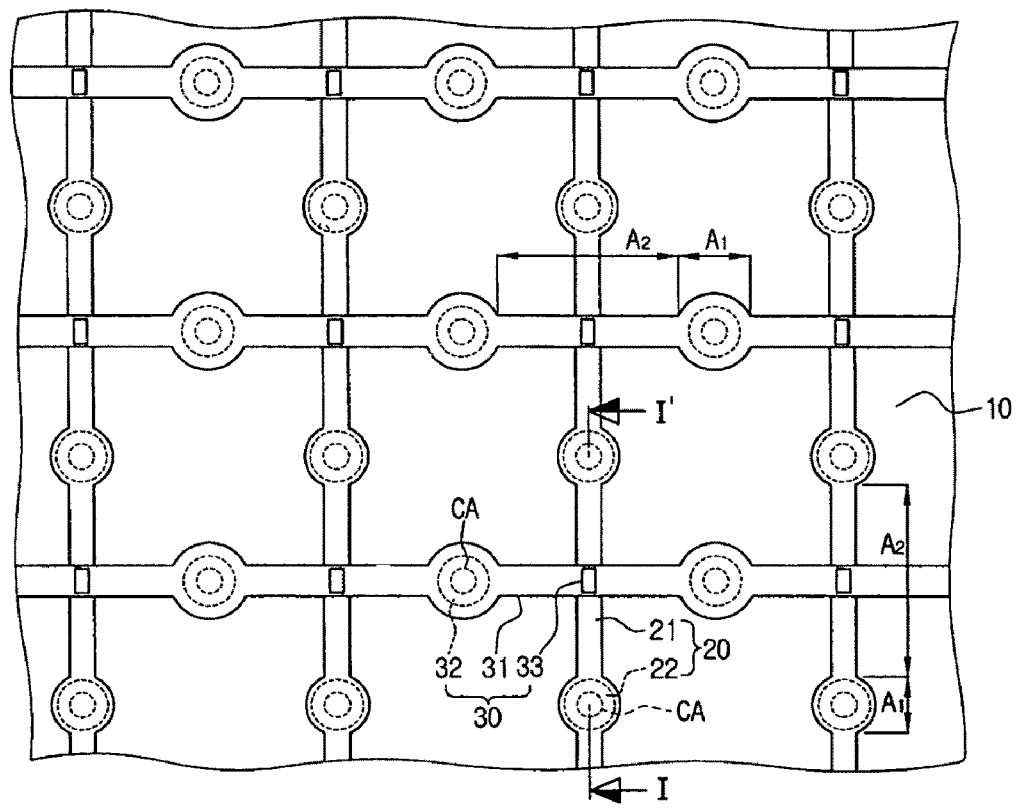
FIG. 1B is a plan view of the micro-heater array according to example embodiments.
Figure 1B:
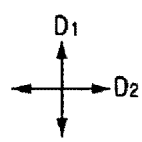
Figure 1C:
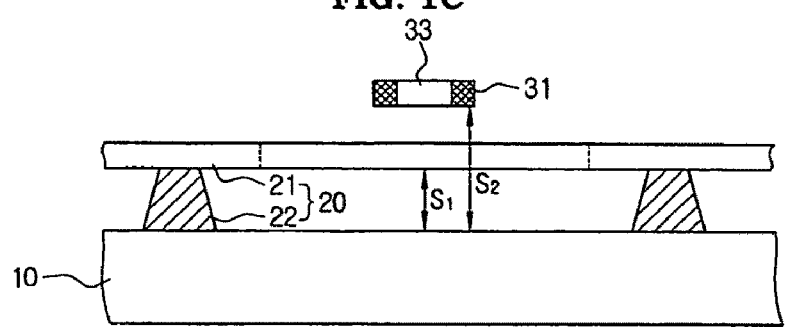
FIG. 1C is a cross-sectional view taken along line I-I' of FIG. 1B.

FIG. 1A is a perspective view of a micro-heater array according example embodiments, FIG. 1B is a plan view of the micro-heater array according to example embodiments, and FIG. 1C is a cross-sectional view taken along line I-I' of FIG. 1B. Referring to FIGS. 1A through 1C, the micro-heater array 101 may include a substrate 10, a plurality of first micro-heaters 20 arranged in parallel in a first direction D1 on the substrate 10, and a plurality of second micro-heaters 30 arranged in parallel in a second direction D2 perpendicular to the first direction D1, while intersecting the plurality of first micro-heaters 20. However, a micro-heater array may also include a single first micro-heater and a single second micro-heater. Each of the plurality of first micro-heaters 20 may include a first heating portion 21 and first supports 22. The first heating portion 21 may be spaced apart from the substrate 10 and extend in first direction D1. The first supports 22 may be partially provided between the substrate 10 and the first heating portion 21 to support the first heating portion 21.

Each of the plurality of second micro-heaters 30 may include a second heating portion 31 and second supports 32. The second heating portion 31 may extend in the second direction D2 perpendicular to the first direction D1 to intersect the first heating portions 21 on the first heating portions 21. The second supports 32 may be partially provided between the substrate 10 and the second heating portion 31 to support the second heating portion 31.

The first and second supports 22 and 32 may be respectively arranged along length directions of the first and second heating portions 21 and 31, except the regions at which the first and second heating portions 21 and 31 intersect each other. The first and second micro-heaters 20 and 30 may have the same and/or different structures and shapes.

As illustrated in FIG. 1C, the second heating portion 31 may be provided on the first heating portion 21 and spaced apart from the first heating portion 21 with a predetermined or given spacing S1. The spacing S1 between the first heating portion 21 and the substrate 10 may be smaller than the spacing S2 between the second heating portion 31 and the substrate 10. For example, the first and second heating portions 21 and 31 may be spaced apart from each other at an intersection region of the first and second heating portions 21 and 31, and the height of the first supports 22 may be smaller than that of the second supports 32.

As illustrated in FIG. 1B, each of the first and second heating portions 21 and 31 may be divided into first areas A1 and second areas A2. The first areas A1 may correspond to contact areas (CA) at which the first and second heating portions 21 and 31 may respectively be in contact with the first and second supports 22 and 32, and each of the second areas A2 may be positioned between the first areas A1. The area of the contact areas CA may be decreased as much as possible while the first and second supports 22 and 32 maintain support of the first and second heating portions 21 and 31, respectively. As the area of the contact areas CA decreases, the heat conduction between the first heating portion 21 and the first supports 22, and the heat conduction between the second heating portion 31 and the second supports 32 decreases. Accordingly, power consumption for driving the micro-heater array 101 may be decreased. Although the first areas A1 and contact areas CA are shown as having a circular shape in FIGS. 1A through 1C, the first areas A1 and contact areas CA may have a rectangular shape and/or any other shape based on the etching method utilized. The width of each of the first areas A1 may be greater than that of each of the second areas A2 in order to facilitate etching of the first and second supports 22 and 32, and the contact areas CA. In addition, when the width of each of the second areas A2 is smaller than that of each of the first areas A1, the light emission and heat generation of the second areas A2 may be more than that of the first areas A1, enabling the control of light-emission and heat-generation positions.

As described above, each of the first and second heating portions 21 and 31 may be divided into the first areas A1 and the second areas A2. Light emission and heat generation at the second areas A2 may increase while the light emission and heat generation at the first areas A1, supported by the first and second supports 22 and 32, may decrease. In addition, the heat-conduction area of the first areas A1 may also decrease. Accordingly, power consumption may be decreased, and an applied voltage may be effectively used for relatively high-temperature heating of the second areas A2.

As the first and second heating portions 21 and 31 intersect each other at the second areas A2, a pn junction may be fabricated between the first and second heating portions 21 and 31 using relatively high-temperature heating at the intersection areas. The first and second heating portions 21 and 31 may be formed of Mo, W, SiC, etc. The first and second heating portions 21 and 31 may be formed of the same material or different materials. Also, light emission and heat generation may occur by the application of power to the micro-heaters 20 and/or 30.

Example embodiments may include an opening 33 formed in the second heating portion 31 at an intersection area of the first and second heating portions 21 and 31, or the second heating portion 31 may be formed of a transparent electrode material. The pn junction formed between the first and second heating portions 21 and 31 may emit or absorb light through the opening 33 or through the transparent second heating portion 31.

The first and second supports 22 and 32 may be formed of a material with a low thermal conductivity in order to prevent loss of heat generated from the first and second heating portions 21 and 31. For example, the first and second supports 22 and 32 may be formed of an insulating material e.g., $SiO_x$, $Si_3N_4$, etc. The substrate 10 may be formed of a glass or plastic material. When the substrate 10 is formed of a glass material, radiant heat (visible light or IR) may transmit through the substrate 10 allowing for relatively high-temperature heating to form a pn junction over a large area. In the micro-heater array example embodiments, heating may be performed at a temperature of 600° C. to 2000° C. in the first and second heating portions while the temperature of the glass substrate may be maintained, for example, below 50° C. Thus, the micro-heater array may be used to fabricate a pn junction using relatively high-temperature heating.

Figure 2A:
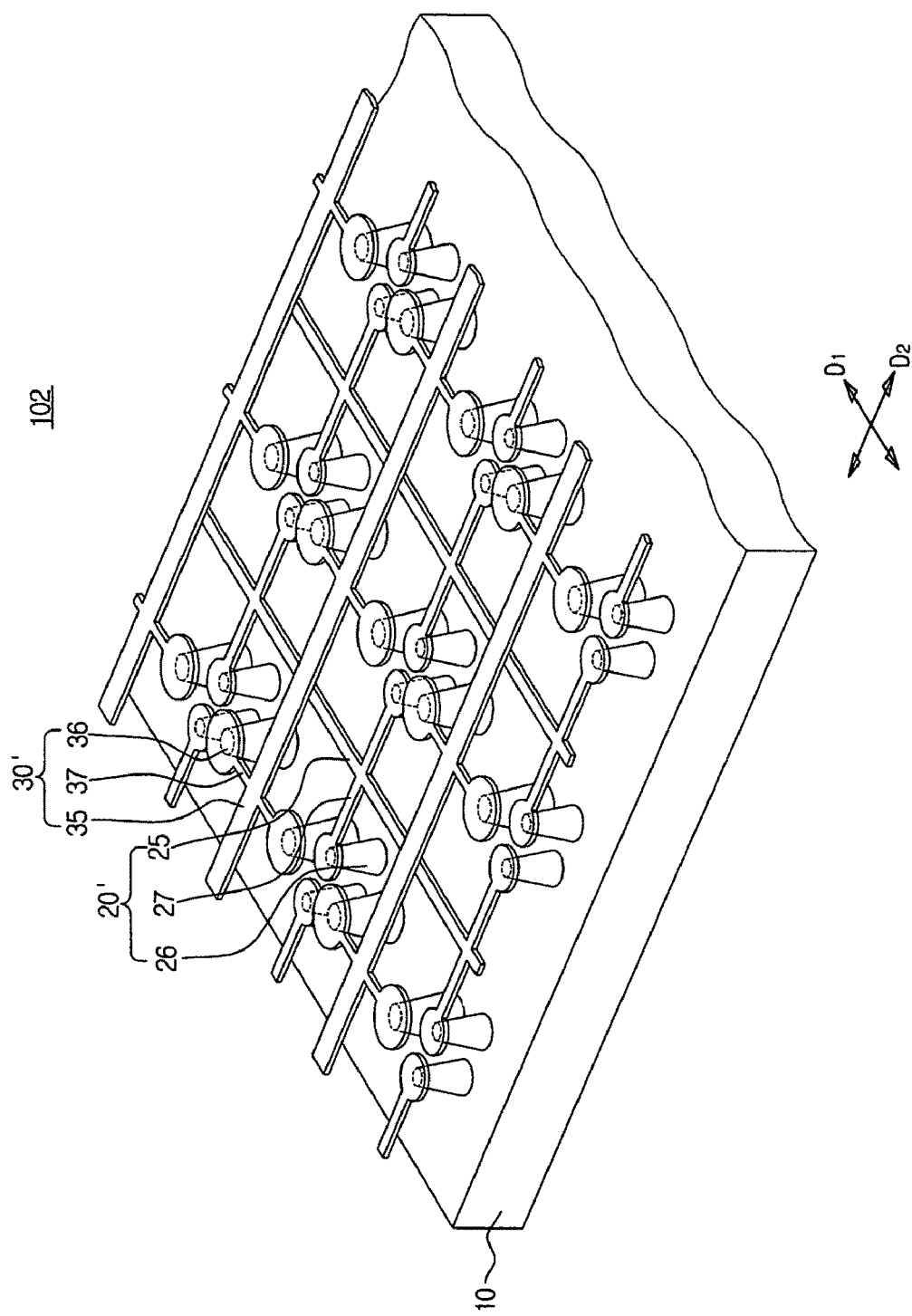
FIGS. 2A and 2B are respectively perspective and plan views of a micro-heater array according to example embodiments.
Figure 2B:
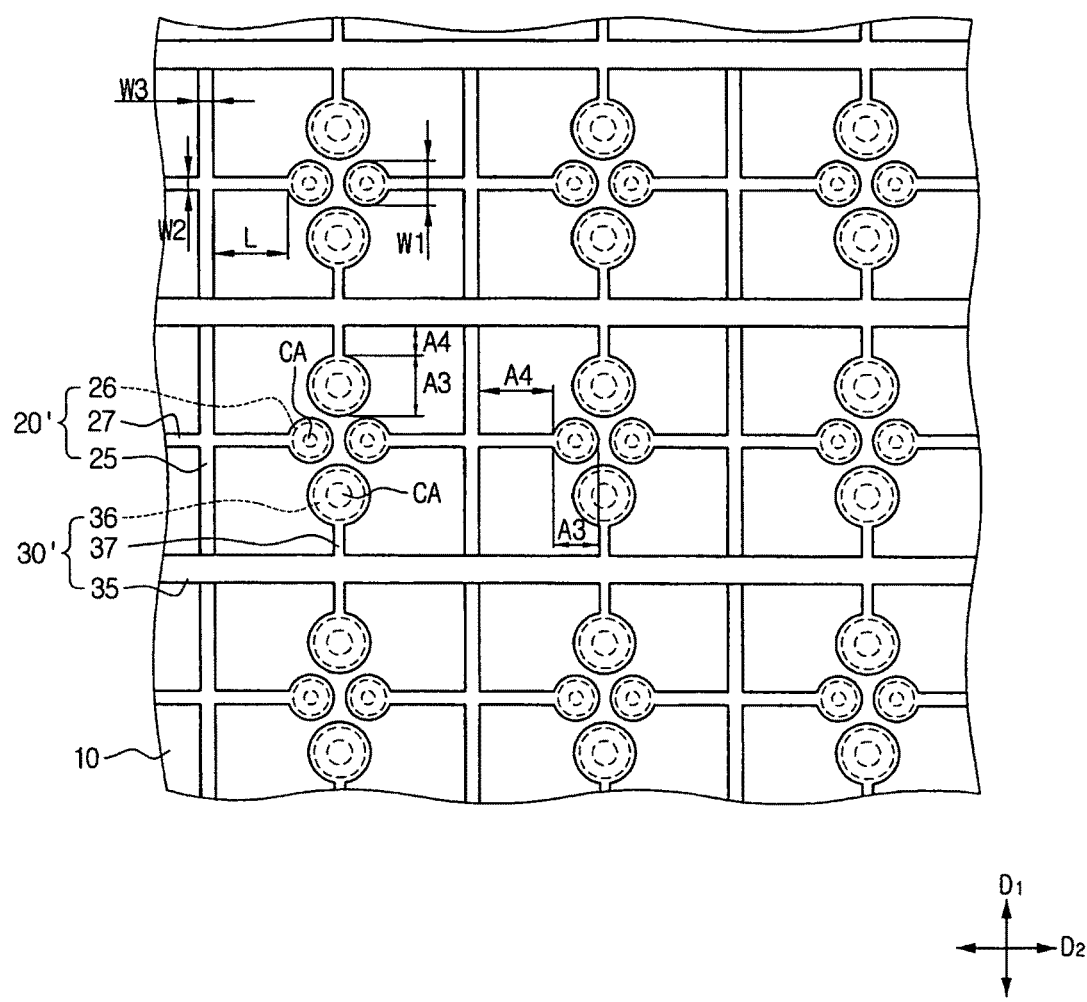

FIGS. 2A and 2B are respectively perspective and plan views of a micro-heater array according to example embodiments. First and second heating portions 25 and 35 in first and second micro-heaters 20' and 30' correspond to the first and second heating portions illustrated in FIGS. 1A through 1C, respectively, and first and second supports 26 and 36 correspond to the first and second supports illustrated in FIGS. 1A through 1C, respectively. However, the first and second micro-heaters 20' and 30' may further include first and second connecting portions 27 and 37. The first and second micro-heaters 20' and 30' also may include the first and second supports 26 and 36, which are not provided beneath the first and second heating portions 25 and 35 as in FIGS. 1A-1C, but may be provided beneath the first and second connecting portions 27 and 37, respectively. Micro-heater array 102 may include the same materials for the substrate 10, the first and second heating portions 25 and 35 and the first and second supports 26 and 36 as those of the substrate 10, the first and second heating portions 21, 31, and the first and second supports 22, 32 illustrated in FIGS. 1A through 1C, respectively.

Referring to FIGS. 2A and 2B, the micro-heater array 102 includes a substrate 10, a plurality of first micro-heaters 20' arranged in parallel in a first direction D1 on the substrate 10, and a plurality of second micro-heaters 30' arranged in parallel in a second direction D2 perpendicular to the first direction D1 while intersecting the plurality of first micro-heaters 20'. Each of the plurality of first micro-heaters 20' may include a first heating portion 25, first supports 26 and first connecting portions 27. The first heating portion 25 may be spaced apart from the substrate 10 and extend in the first direction D1. The first connecting portions 27 may extend from both sides of the first heating portion 25 and be spaced apart from each other along a longitudinal direction of the first heating portion 25. The first supports 26 may be provided between the substrate 10 and the first connecting portions 27 to support the first heating portion 25 and the first connecting portions 27.

Each of the plurality of second micro-heaters 30' may include a second heating portion 35, second supports 36 and second connecting portions 37. The second heating portion 35 may be spaced apart from the substrate 10 and extend in the second direction D2 perpendicular to the first direction D1, to intersect the first heating portion 25 on the first heating portion 25. The second connecting portions 37 may extend from both sides of the second heating portion 35 and may be spaced apart from each other along a longitudinal direction of the second heating portion 35. The second supports 36 may be provided between the substrate 10 and the second connecting portions 37 to support the second heating portion 35 and the second connecting portions 37.

The height of the first supports 26 may be smaller than that of the second supports 36, so that the first and second heating portions 25 and 35 may be spaced apart from each other by a predetermined or given distance at an intersection region of the first and second heating portions 25 and 35. Each of the first and second heating portions 25 and 35 may emit light and generate heat by applying a voltage to both ends thereof. The first and second heating portions 25 and 35 may be driven independently. As discussed above, the second heating portion 35 may be formed of a transparent electrode material.

The configuration and shape of the plurality of second micro-heaters 30' correspond to those of the plurality of first micro-heaters 20', except that the plurality of second micro-heaters 30' may be arranged in a direction perpendicular to the plurality of first micro-heaters 20' on the substrate 10. Following, the structure of the plurality of first micro-heaters 20' will be described in detail.

As illustrated in FIGS. 2A and 2B, first connecting portions 27 may be provided at two sides of the first heating portion 25, not including the intersection regions of the first and second heating portions 25 and 35. The first connecting portions 27 may extend in the second direction D2 perpendicular to the longitudinal direction D1 of the first heating portion 25, and may be symmetrically provided on the two sides of the first heating portion 25. However, the first connecting portions 27 may be provided asymmetrically on the two sides of the first heating portion 25 as well. The first connecting portions 27 may be formed of the same material as that of the first heating portion 25, and may be integrally formed with the first heating portion 25 through the same process.

The first supports 26 may be partially provided beneath the respective first connecting portions 27 to be partially in contact with the first connecting portions 27. Each of the first connecting portions 27 may be divided into third areas A3 and fourth areas A4. The third areas A3 may correspond to contact areas CA at which the first connecting portions 27 are in contact with the first supports 26, respectively. The fourth areas A4 may be positioned between the first heating portion 25 and the third areas A3. Supports 26 may be provided beneath end portions of the respective first connecting portions 27, which may be a relative distance from the first heating portion 25. The third areas A3 of each of the first connecting portions 27 may correspond to the end portion of each of the first connecting portions 27.

As illustrated in FIGS. 2A and 2B, the first connecting portions 27 may be supported by the first supports 26, so that the first heating portion 25 may be integrally formed with the first connecting portions 27 and may be supported by the first supports 26 without contacting the first supports 26. When the first heating portion 25 and the first supports 26 are spaced apart from each other by the first connecting portions 27, temperature distribution of the first heating portion 25 may not be influenced by the shape of each of the first supports 26. Therefore, the temperature distribution of the first heating portion 25 may be maintained uniformly.

In the first micro-heater 20', the area at which heat conduction occurs between the first heating portion 25 and the first connecting portions 27, and between the first heating portion 25 and the first supports 26 may be decreased while maintaining the support of the first heating portion 25, thereby saving power consumption for driving the first micro-heater 20'. For example, thermal conductivity from both sides of the first heating portion 25 to the first connecting portions may be decreased as the length L of the fourth areas A4 of each of the first connecting portions 27 is increased, and as the widths W1 and W2 of each of the first connecting portions 27 are decreased. In addition, thermal conductivity from the first connecting portions 27 to the first supports 26 may be decreased as the width of the contact areas CA is decreased.

Further, if the length L of the fourth areas A4 of each of the first connecting portions 27 are increased, or the widths W1 and W2 and the contact areas CA of each of the first connecting portion 27 are decreased (while maintaining the support of the first heating portion 25), loss of heat generated from the first heating portion 21 may be decreased. As a result, power consumption for driving the first micro-heater 20' may be decreased, and applied power may be used for relatively high-temperature heating of the first heating portion 25.

As illustrated in FIG. 2B, the width W2 of the fourth areas A4 of each of the first connecting portions 27 may be formed to be smaller than the width W3 of the first heating portion 25, for example, so the amount of heat transmitted from the first heating portion 25 to the fourth areas A4 of the first connecting portions 27 may be decreased. In order to decrease the loss of heat transmitted from the first connecting portions 27 to the first supports 26, the width of the contact areas CA may be smaller than the width W1 of the third areas A3.

When the area of the contact areas CA and the third areas A3 of each of the first connecting portions 27 is extremely small, supporting the first heating portion 25 through the first supports 26 may become difficult, and structural stability may not be ensured. Thus, the area of the contact areas CA and the third areas A3 should have a minimal area or larger, with which the first supports 26 are able to maintain the support of the first heating portion 25 and the first connecting portions 27. For example, as illustrated in FIG. 2B, the width W1 of the third areas A3 and the width of the contact areas CA may be formed to be greater than the width W2 of the fourth areas A4.

As described above, in the second micro-heater 30', the area of regions at which the heat conduction occurs between the second heating portion 35 and the second connecting portions 37, and between the second heating portion 35 and the second supports 36 may also be controlled, thereby reducing power consumption for driving the second micro-heater 30'. In FIGS. 2A and 2B, the contact areas CA and third areas A3 of the first and second connecting portions 27 and 37 may have circular shapes, rectangular shapes, etc., based on the etching method used.

In the micro-heater array 102, the plurality of first and second micro-heaters 20' and 30' may intersect each other to form a matrix, and temperature distribution may be uniform throughout the first and second heating portions 25 and 35. The micro-heater array 102 may be used for electronic devices requiring heat generation and light emission over and/or across a large area.

Figure 3A:
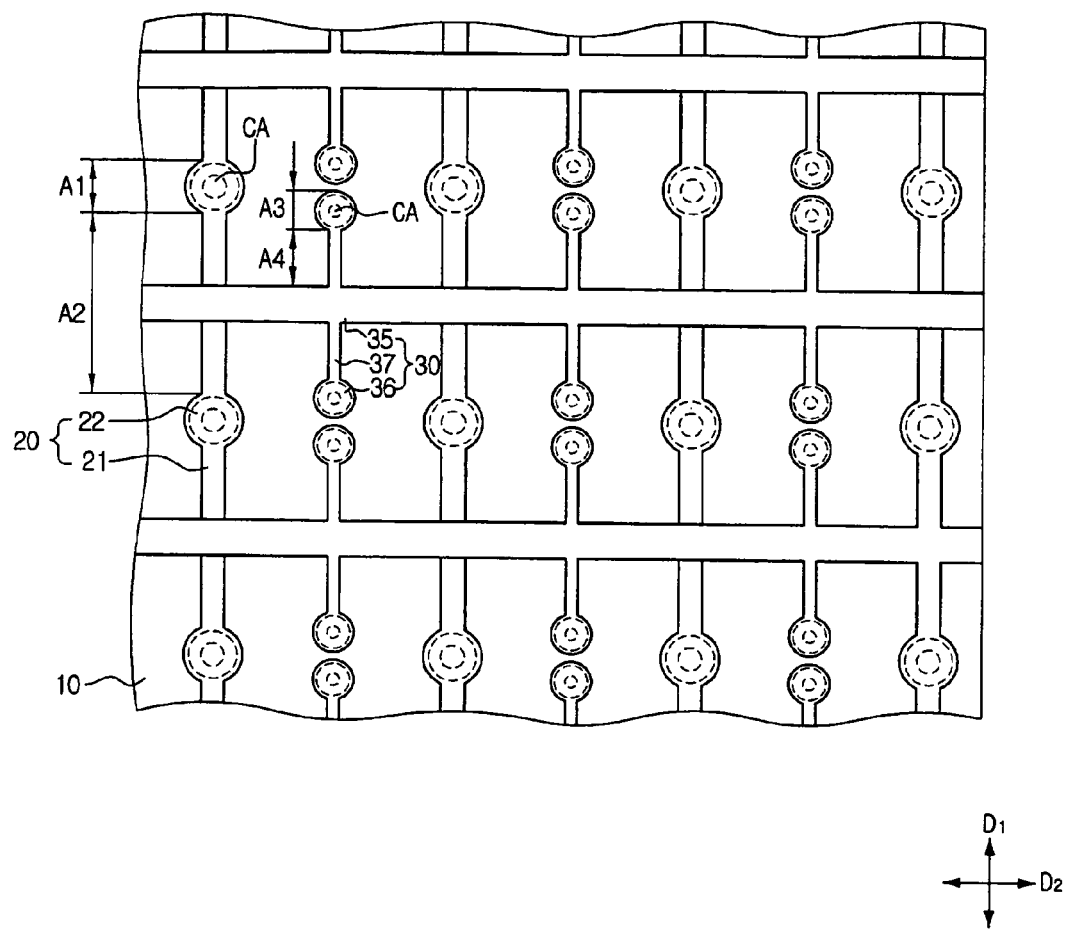
FIG. 3A is a plan view of a micro-heater array according to example embodiments.

FIG. 3A is a plan view of a micro-heater array according to example embodiments. Among components illustrated in FIG. 3, the same components as those illustrated in FIGS. 1A through 2B are designated by the same reference numerals, and their detailed descriptions will be omitted. The micro-heater array 103 may includes a substrate 10, a plurality of first micro-heaters 20 arranged in parallel in first direction D1 on the substrate 10, and a plurality of second micro-heaters 30' arranged in a second direction D2 perpendicular to the first direction D1 while intersecting the plurality of first micro-heaters 20.

Each of the plurality of first micro-heaters 20 may include a first heating portion 21 and first supports 22. The first heating portion 21 may be spaced apart from the substrate 10 and extend in the first direction D1. The first supports 22 may be partially provided between the substrate 10 and the first heating portion 21 to support the first heating portion 21.

Each of the plurality of second micro-heaters 30' may include a second heating portion 35, second supports 36 and second connecting portions 37. The second heating portion 35 may be spaced apart from the substrate 10 and extend in the second direction D2 perpendicular to the first direction D1, to intersect the first heating portion 25 on the first heating portion 25. The second connecting portions 37 may be extended from both sides of the second heating portion 35 and may be arranged to be spaced apart from each other along a longitudinal direction of the second heating portion 35. The second supports 36 may be provided between the substrate 10 and the second connecting portions 37 to support the second heating portion 35 and the second connecting portions 37.

The height of the first supports 26 may be smaller than that of the second supports 36, so that the first and second heating portions 25 and 35 may be spaced apart from each other at a predetermined or given distance at an intersection region of the first and second heating portions 25 and 35. Each of the first and second heating portions 25 and 35 may emit light and generate heat by applying a voltage to both ends thereof. The first and second heating portions 25 and 35 may be driven independently.

Figure 3B:
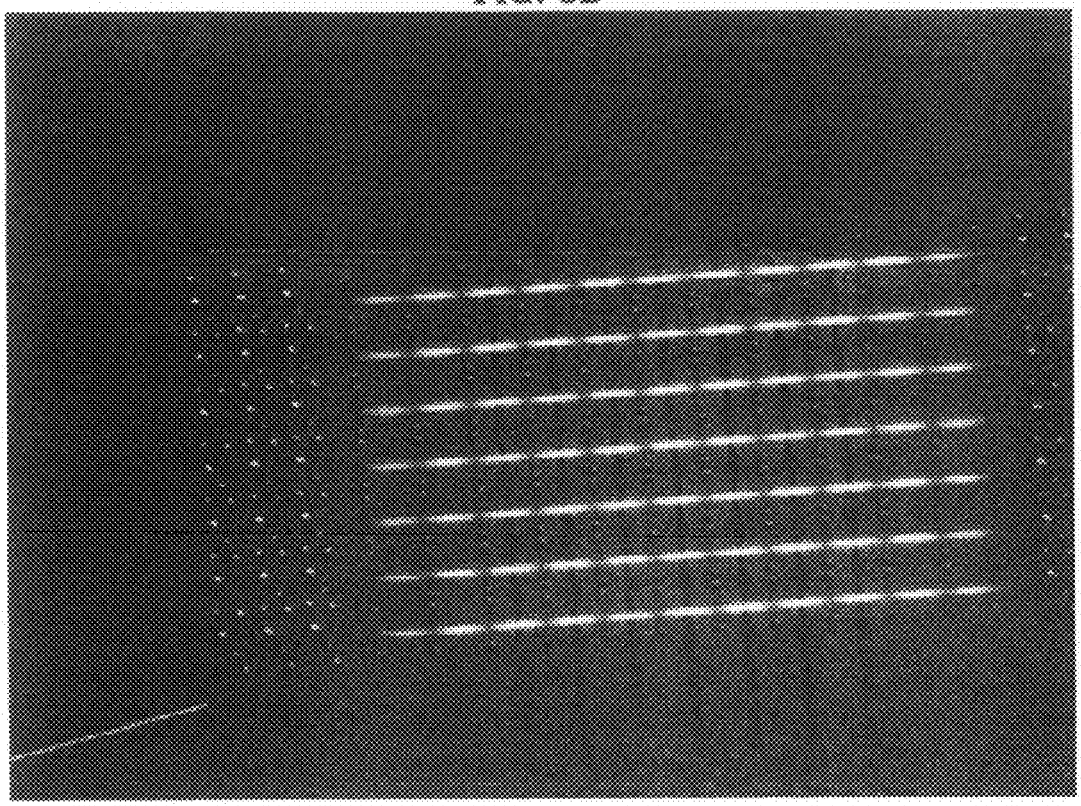
FIG. 3B is a CCD image showing a heat-generation state of the micro-heater array illustrated in FIG. 3A.

In the micro-heater array according to example embodiments, the second heating portion 35 of the second micro-heater 30' illustrated in FIG. 3A may be provided beneath the first heating portion 21 of the first micro-heater 20 illustrated in FIG. 3A. FIG. 3B is a CCD image showing a heat-generation state of the micro-heater array illustrated in FIG. 3A. The CCD image shows a heat-generation state of the second heating portion 35 when a voltage is applied to the plurality of second micro-heaters 30' illustrated in FIG. 3A. As illustrated in FIG. 3B, the heat-generation state may be relatively uniform in the plurality of second micro-heaters 30'.

Figure 4A:
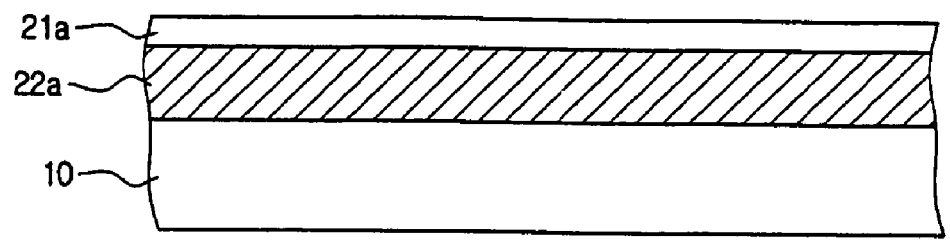
FIGS. 4A through 4E are cross-sectional views illustrating a method of manufacturing the micro-heater array illustrated in FIGS. 1A through 1C according to example embodiments.

FIGS. 4A through 4E are cross-sectional views illustrating a method of manufacturing the micro-heater array illustrated in FIGS. 1A through 1C according to example embodiments. However, example embodiments are not limited to those shown in FIGS. 1A-1C, for example, the described processes of manufacturing micro-heater arrays may be used to fabricate micro-heater arrays, 102 or 103. Referring to FIG. 4A, a first sacrificial layer 22a may be deposited on a substrate 10. Layer 22a may be etched to form first supports 22 and the lower portions of second supports 32. A first heating layer 21a to be patterned as a first heating portion 21 may be deposited on the first sacrificial layer 22a.

Figure 4B:
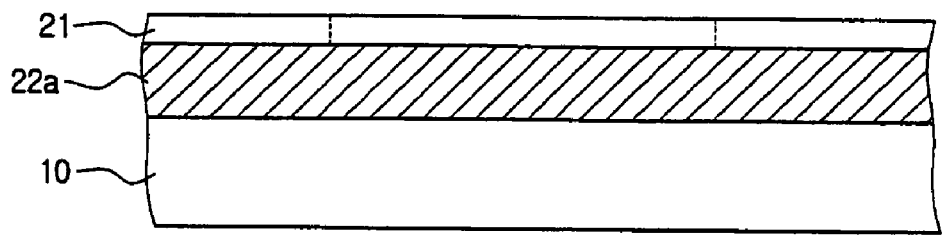

Referring to FIGS. 1B and 4B, the first heating layer 21a may extend in the first direction D1 and may be patterned as the first heating portion 21 divided into first and second areas A1 and A2. The patterning may be performed using methods known in the art, including dry etching, wet etching, etc.

Figure 4C:
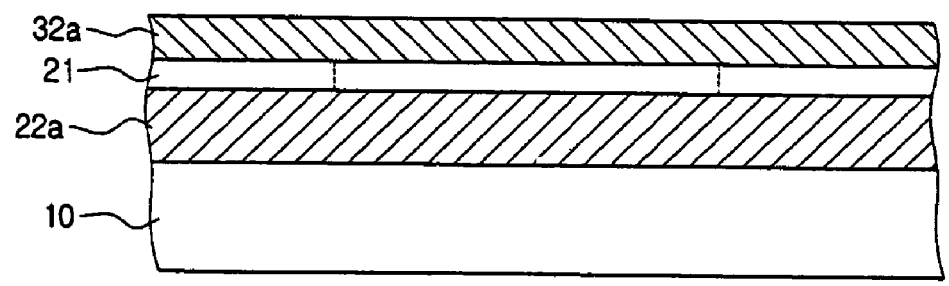

Referring to FIG. 4C, a second sacrificial layer 32a may be deposited on the first heating portion 21 and the first sacrificial layer 22a. The second sacrificial layer 32a may be etched to form upper portions of the second supports 22. A second heating layer 31a may be deposited on the second sacrificial layer 32a to be patterned as a second heating portion 31.

Figure 4D:
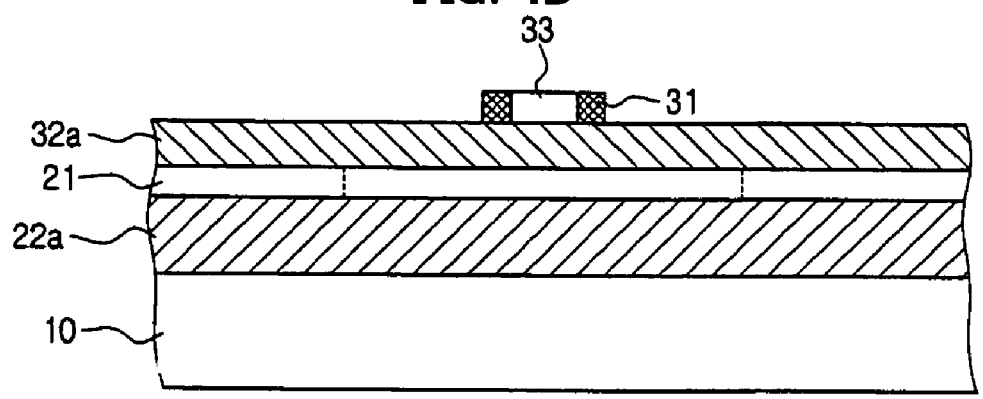
Figure 4E:
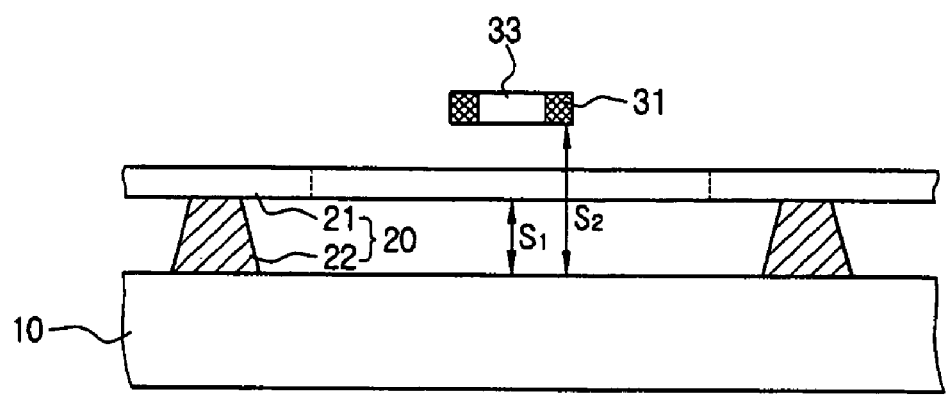

As illustrated in FIGS. 1B and 4D, the second heating layer 31a may extend in the second direction D2 perpendicular to the first direction D1 to be patterned as the second heating portion 31 intersecting the first heating portion 21. The second heating portion 31 may be patterned to have an opening 33 at an intersection area of the first and second heating portions 21 and 31.

As illustrated in FIGS. 1A through 1C and FIG. 4E, the first and second supports 22 and 32 may be formed by wet (isotropic) etching the first and second sacrificial layers 22a and 32a. The etching may be performed so that the area of the respective contact areas CA of the first and second supports 22 and 32 and the first and second heating portions 21 and 31 decreases by adjusting the time taken to perform the etching.

If a glass substrate is used as the substrate 10, the deposition of the first sacrificial layer 22a may be omitted, and the first supports 22 and the lower portions of the second supports 32 may be formed by etching an upper portion of the substrate 10. In addition, the second heating portion 31 may include a deposited transparent electrode material.

Example embodiments for forming pn junctions using, e.g., the micro-heater array 101 illustrated in FIGS. 1A through 1C will be described. However, example embodiments may be equally applied when forming pn junctions using the micro-heater arrays according to other example embodiments.

Figure 5:
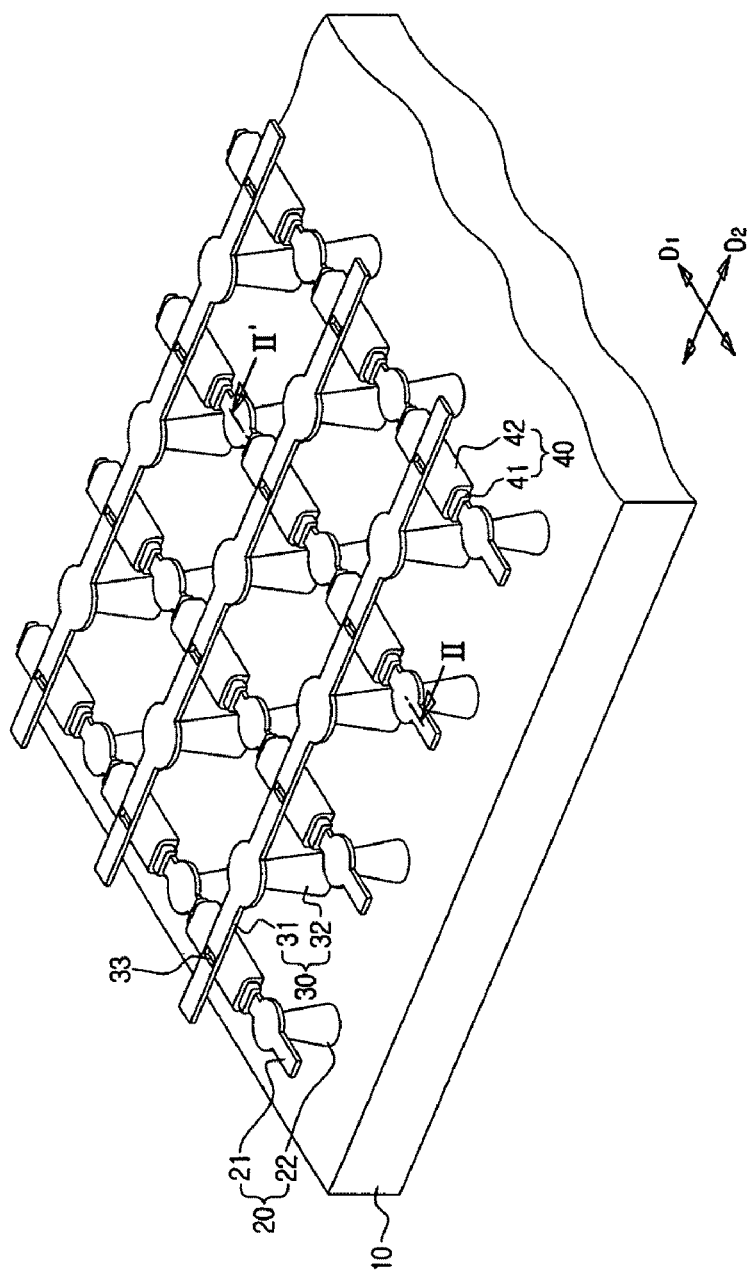

FIG. 5 is a perspective view illustrating a pn junction formed between first and second heating portions using a micro-heater array according to example embodiments. Among components illustrated in FIG. 5, the same components as those illustrated in FIGS. 1A through 1C are designated by the same reference numerals, and detailed descriptions therefore will be omitted.

A p-type material layer 41 and an n-type material layer 42 may be formed at an intersection area of the first and second heating portions 21 and 31, e.g., between the first and second heating portions 21 and 31, thereby forming a pn junction 40. The p-type material layer 41 and the n-type material layer 42 may be formed by using heat generated from one or more of the first and second heating portions 21 and 31 when a voltage is applied to the micro-heater array 101. However, the p-type material layer 41 and the n-type material layer 42 may be reversed also to form an np junction.

As illustrated in FIGS. 1A through 1C, the plurality of first and second micro-heaters 20 and 30 may be driven independently. The pn junction 40 may be formed between the first and second heating portions by driving the plurality of first micro-heaters 20 and/or by driving the plurality of second micro-heaters 30. Also, the p-type material layer 41 may be formed in the second areas A2 of the first heating portion 21 by sequentially driving the plurality of first and second micro-heaters 20 and 30, and the n-type material layer 42 may be formed in the second areas A2 of the second heating portion 31, thereby forming the pn-junction 40 between the first and second heating portions 21 and 31. In FIG. 5, a pn junction may be formed using the heat generated from the first heating portion 21 when applying a voltage to the plurality of first micro-heaters 20. As the first heating portions 21 included in the respective plurality of first micro-heaters 20 may each individually generate heat, the pn junctions 40 may be formed at a portion of the intersection areas of the first and second heating portions 21 and 31.

As relatively high-temperature heating may be locally performed at the second areas A2 of the first heating portion 21, the p-type material layer 41 and the n-type material layer 42 may be formed at the second areas A2 of the first heating portion, to form the pn junction 40. Since the first and second heating portions 21 and 31 intersect each other at the second areas A2 of the first and second heating portions 21 and 31, the pn junction 40 may be formed at the intersection area of the first and second heating portions 21 and 31.

Figure 6:
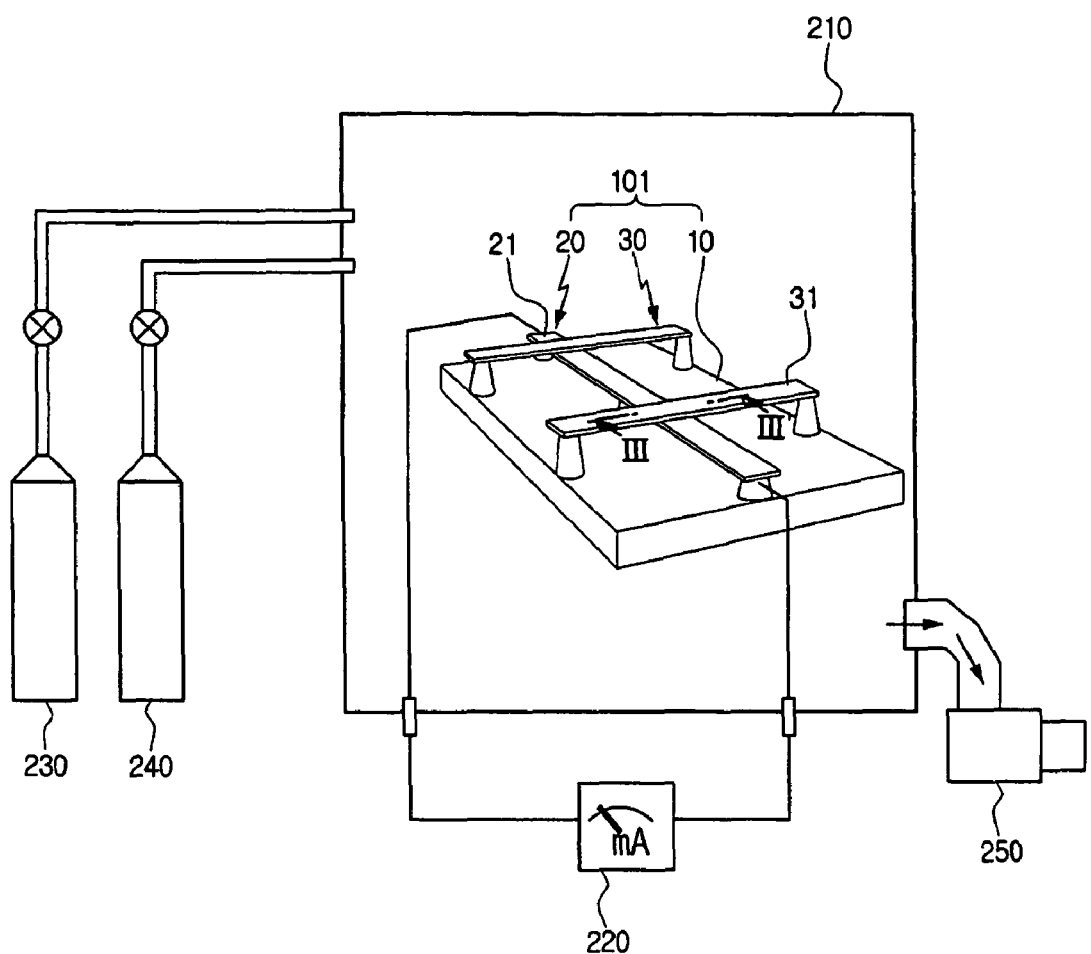
Figure 7A:
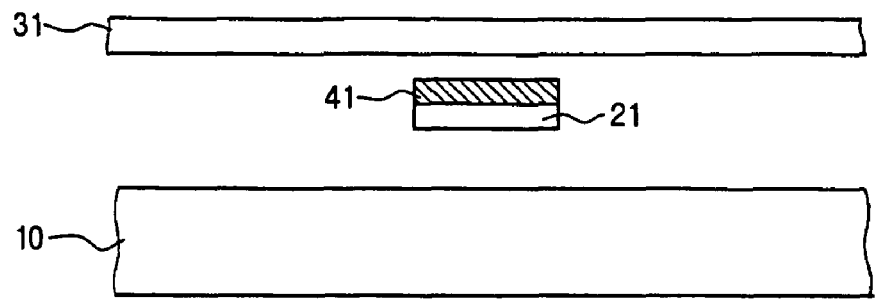
FIGS. 7A through 7C are cross-sectional views taken along line III-III' of FIG. 6, illustrating forming a pn junction between first and second heating portions according to example embodiments.
Figure 7B:
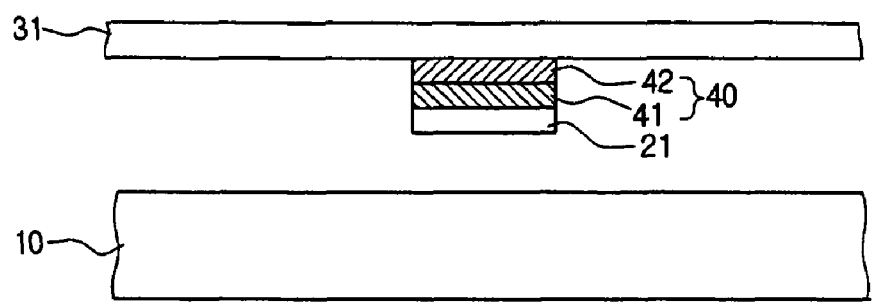
Figure 7C:
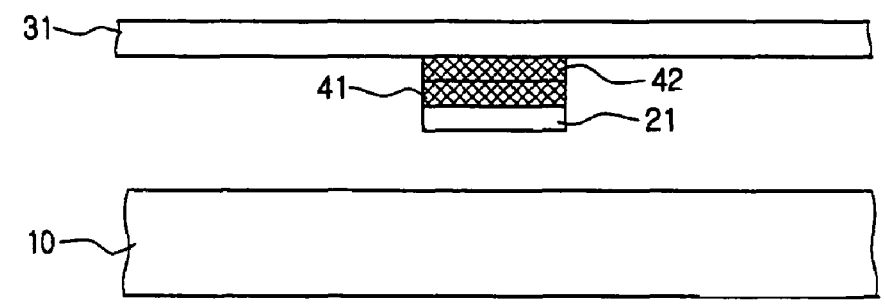

FIG. 6 is a view illustrating processes of forming a pn junction portion using the micro-heater array according to example embodiments, in which the micro-heater array illustrated in FIG. 1A is shown as an example for illustration. FIGS. 7A through 7C are cross-sectional views taken along line III-III' of FIG. 6, illustrating example embodiments of forming a pn junction between the first and second heating portions 21 and 31.

Referring to FIGS. 6 and 7A through 7C, a method of fabricating a pn junction according to example embodiments is described. A micro-heater array 101 may be provided in a chamber 210. A voltage may be applied to any one of the first and second micro-heaters 20 and 30 by an external power supply 220 and a first heating portion 21 may be heated to a relatively high temperature by applying a voltage to the first micro-heater 20. The first heating portion 21 may generate heat at a relatively high temperature and emit radiant heat in the form of visible light and/or infrared light.

A source gas and a p-type doping gas may be injected into the chamber 210 through a first gas supply tube 230 connected to the chamber 210 from the outside of the chamber 210, to grow a p-type material layer 41 on the first heating portion 21 as illustrated in FIG. 7A. The source gas and the p-type doping gas injected into the chamber 210 react with each other to grow the p-type material layer 41 on the relatively high-temperature first heating portion 21. Depending on the process conditions, the growth of the p-type material layer 41 may be controlled depending on the heat-generation temperature of the first heating portion 21, the type of gas and the heating time. For example, the p-type material layer 41 may be grown only on the top surface of the first heating portion 21 and/or on both top and bottom surfaces of the first heating portion 21. As relatively high-temperature heat is generated at a second area of the first heating portion 21 that may not be in contact with first supports 22, the p-type material layer 41 may be grown mainly on the second area.

Subsequently, a source gas and an n-type doping gas may be injected into the chamber 210 through a second gas supply tube 240 connected to the chamber 210 from the outside of the chamber 210 while maintaining the heating state of the first heating portion 21, to grow an n-type material layer 42 between the p-type material layer 41 and the second heating portion 31 as illustrated in FIG. 7B. The source gas and n-type doping gas injected into the chamber 210 react with each other on the relatively high-temperature first heating portion 21 and may grow an n-type material layer 42 on the p-type material layer 41, resulting in a pn junction 40 formed between the first and second heating portions 21 and 31. Also, to form the n-type material layer 42, a voltage may be applied not to the first micro-heater 20, but to the second micro-heater 30, to grow the n-type material layer 42 using the heat generated from the second heating portion 31.

As illustrated in FIG. 7C, a process of annealing the p-type and n-type material layers 41 and 42 may be added after forming the pn junction 40. When the p-type and n-type material layers 41 and 42 are amorphous thin films with imperfect crystallization, the p-type and n-type material layers 41 and 42 may be crystallized through heat treatment by annealing. In addition, contact resistance between the pn junction 40 and the first and second heating portions 21 and 31 may be reduced. An annealing process may be performed using the relatively high-temperature heat generated from one or more of the first and second heating portions 21 and 31 by simultaneously or individually driving the first and second micro-heaters 20 and 30. A scrubber 250 may be provided at a lower portion of the chamber 210 to absorb and neutralize the gas remaining in the chamber 210 after forming the p-type material layer 41 and/or the n-type material layer 42.

For example, using the micro-heater array 101, to fabricate a Si pn junction, silane ($SiH_4$) may be used as a source gas for forming Si. To grow a p-type material layer, diborane ($B_2H_6$) may be used as a p-type doping gas, and when growing an n-type material layer, phosphine ($PH_3$) may be used as an n-type doping gas. Alternatively, to fabricate a GaN pn junction as a metal organic source, trimethylgallium (TMGa) and ammonia ($NH_3$) may be used as a source gas for forming GaN. When growing a p-type material layer, (cyclopentadienylmagnesium) $Cp_2Mg$ may be used as a p-type doping gas, and when growing an n-type material layer, $SiH_4$ may be used as an n-type doping gas.

Example embodiments include fabricating a pn junction through a metal organic chemical vapor deposition (MOCVD) process using e.g., the micro-heater array 101.

When using the micro-heater array according to example embodiments, only the first and second heating portions, with which a pn junction is fabricated, may be locally heated at relatively high temperatures while maintaining the temperature of the chamber, particularly the temperature of the substrate, at a lower temperature, unlike in typical CVD processes. Accordingly, a high-quality pn junction that requires relatively high-temperature heating may be fabricated on a glass substrate. The high-quality pn junction may be a pn junction with high crystallinity, such as a pn junction having a micro-crystal or poly-crystal structure. As plasma or complicated heating tools are not necessary to fabricate the pn junctions according to example embodiments, the process chamber may be simplified, and the cost of fabricating pn-junction devices may be decreased.

For example, a growth temperature of about 1000° C. may be required to grow single crystalline GaN used for e.g., as a light emitting diode (LED). As a glass substrate may soften at 550° C. or above, growing a high quality single crystalline GaN may be difficult at temperatures below 550° C. Due to needing such a relatively high-temperature heating condition, available substrates may be limited to high-priced substrates, e.g., silicon wafers, $Al_2O_3$ substrates and SiC substrates, not glass substrates. Accordingly, as fabricating a pn junction over a large area may be difficult, there is a limit to using LEDs as surface light sources or light sources of a display.

However, as the temperature of the glass substrate may be maintained at relatively lower temperatures when fabricating a pn junction using the micro-heater arrays according to example embodiments, single crystalline GaN pn junctions with increased quality may be fabricated. Accordingly, a GaN pn junction over a large area may be fabricated, and thus an LED surface light source may be implemented with such GaN pn junctions. Furthermore, LED surface light sources may be used as light sources of a large-sized display having increased efficiency and longer lifespan. In addition, as a pn junction may be directly grown on the first and second heating portions 21 and 31 using the relatively high-temperature heat generated from the first and second heating portions 21 and 31, a pn-junction device may be easily fabricated.

Figure 8A:
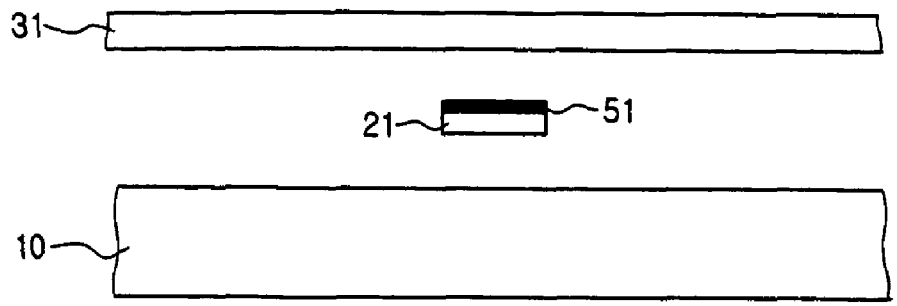
FIGS. 8A through 8C are cross-sectional views taken along line III-III' of FIG. 6, illustrating forming a pn junction between first and second heating portions according to example embodiments.
Figure 8B:
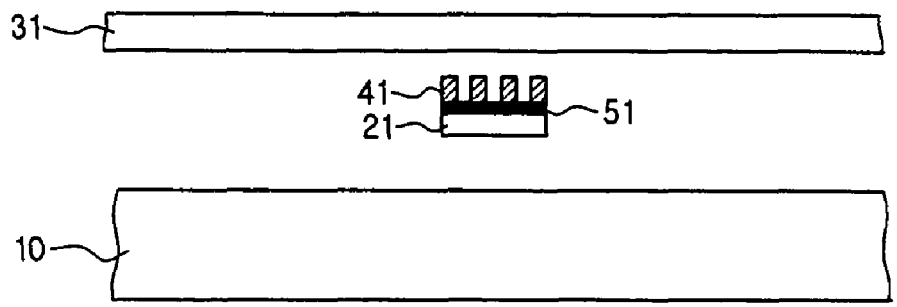
Figure 8C:
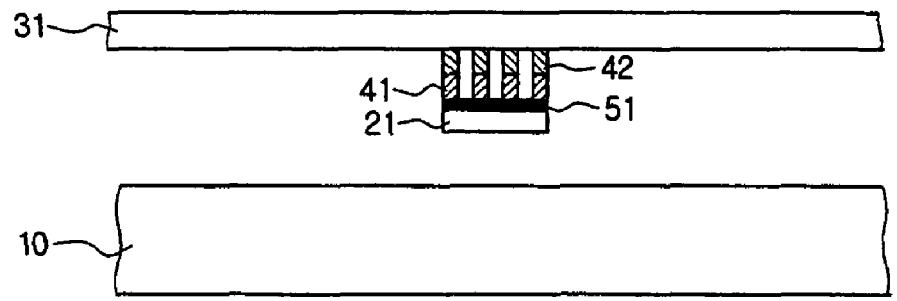

FIGS. 8A through 8C are cross-sectional views taken along line III-III' of FIG. 6, illustrating example embodiments of forming a pn junction between the first and second heating portions 21 and 31. Among components illustrated in FIGS. 8A through 8C, the same components as those illustrated in FIGS. 7A through 7C are designated by the same reference numerals, and detailed descriptions therefore will be omitted.

Example embodiments may include a nano-wire type pn junction fabricated by forming a catalyst layer 51 on any one of the first and second heating portions 21 and 31 before fabricating the pn junction. The processes of fabricating a pn junction may be the same as those of fabricating a pn junction illustrated in FIGS. 7A through 7C, except the process of forming a catalyst layer in a separate chamber before fabricating the pn junction.

In the separate chamber, a catalyst layer 51 may be formed on any one of the first and second heating portions 21 and 31 at the portion to form a pn junction. After forming the catalyst layer 51, a nano-wire type pn junction may be fabricated in a specific region of the first and second heating portions 21 and 31. As illustrated in FIG. 8A, a catalyst layer 51 may be formed on the top surface of the first heating portion 21 in a region at which the first and second heating portions 21 and 31 intersect each other. The catalyst layer 51 may be formed through a separate process, e.g., deposition, sputtering or electron-beam deposition.

A micro-heater array 101 having the catalyst layer 51 may be provided in the chamber 210. As illustrated in FIGS. 6 and 8B, a nano-wire type p-type material layer 41 may be grown on the catalyst layer 51 of the first heating portion 21 by injecting a source gas and a p-type doping gas into the chamber 210 while heating the first heating portion 21 at a relatively high temperature by applying a voltage to the first micro-heater 20. As illustrated in FIG. 8C, a nano-wire type n-type material layer 42 may be grown between the p-type material layer 41 and the second heating portion 31 by injecting a source gas and an n-type doping gas into the chamber 210 while maintaining the heating state of the first heating portion 21. A nano-wire type pn junction 40 may be fabricated between the first and second heating portions 21 and 31. The first heating portion 21, to which the voltage is applied, may generate heat at relatively high temperatures and emit radiant heat as visible light and/or infrared light. A pn junction with a nano-structure may be formed at a temperature of about 500° C. or above. Examples of nano-wire type pn junctions using a catalyst layer include pn-junction devices using carbon nano-tubes (CNT), GaN nano-wire pn-junction devices, etc.

When fabricating a CNT using a pn junction, a catalyst layer 51 may be formed using a catalyst, e.g., Ni, Fe, Invar (64FeNi), etc. A micro-heater array may be provided in a chamber, and acetylene ($C_2H_2$) and argon (Ar) may be injected into the chamber to grow the CNT. P-type and n-type doping materials may then be sequentially injected into the chamber.

Example embodiments further include processes of forming a buffer layer on any one of the first and second heating portion as a separate process. For example, when fabricating a GaN pn junction on a glass substrate, complete epitaxial growth of GaN may be difficult due to the lattice mismatch between the GaN and the glass substrate. Thus, a buffer layer may be formed on any one of the first and second heating portions 21 and 31. Pn junctions of GaN may then be grown on the buffer layer so, for example, the lattice mismatch between the glass substrate and the GaN may be prevented. Accordingly, high-quality poly-GaN may be obtained. The buffer layer may be formed by forming a material suitable for lattice match with GaN as a thin film on a glass substrate and then orienting the material in a specific direction. The GaN may also be subjected to epitaxial growth depending on the arrangement direction of the buffer layer. For example, if a zinc oxide (ZnO) thin film is formed on the first heating portion 21 having a preferred crystalline orientation of [0001] through a deposition process e.g., sputtering, GaN may also be grown to have the preferred orientation of [0001]. Accordingly, high-quality GaN may be formed using a glass substrate that may be less expensive and more easily available as the substrate 10 of the micro-heater arrays, as opposed to single crystalline substrates e.g., SiC or GaN. Further, the high-quality GaN may be used for LEDs.

Figure 9:
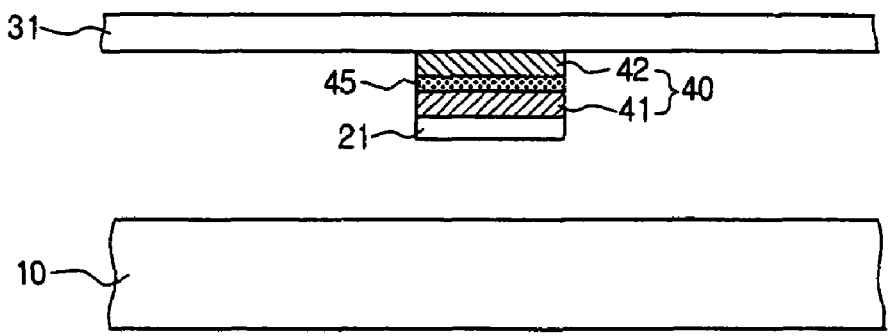

FIG. 9 is a cross-sectional view taken along line III-III' of FIG. 6, illustrating example embodiments including an $In_xGa_{1-x}N$ layer between the first and second heating portions. Example embodiments of forming an $In_xGa_{1-x}N$ layer between the p-type and n-type material layers 41 and 42 are further described.

Referring to FIGS. 6 and 9, a p-type material layer 41 may be formed on the first heating portion 21, and an $In_xGa_{1-x}N$ layer 45 may then be formed on the p-type material layer 41. Separate gas supply tubes through which trimethyliridium (TMIn), TEGa and $NH_3$ may be respectively injected into the chamber 210 are provided outside of the chamber 210. TMIn, TEGa and $NH_3$ may be used as sources of In, Ga and N for forming an $In_xGa_{1-x}N$ layer, respectively. An $In_xGa_{1-x}N$ layer 45 with various composition ratios may be formed by controlling the supply amounts of the TMIn, TEGa and $NH_3$, respectively, injected into the chamber 210.

An n-type material layer 42 may then be formed between the $In_xGa_{1-x}N$ layer 45 and the second heating portion 31, thereby forming a pn junction including the $In_xGa_{1-x}N$ layer 45. In an $In_xGa_{1-x}N$ layer, the composition of In, Ga and N may change depending on the value of "x", and light with different wavelengths may be emitted depending on the composition of the $In_xGa_{1-x}N$ layer. Thus, the $In_xGa_{1-x}N$ layer 45 formed between the p-type and n-type material layers 41 and 42, may have various colors including red, green and blue, by controlling the wavelength of the light emitted from the pn junction. When the pn junction including the $In_xGa_{1-x}N$ layer 45 is applied to a display, various colors may be implemented without separate devices for color implementation, and therefore, manufacturing light and thin display devices is possible.

Figure 10:
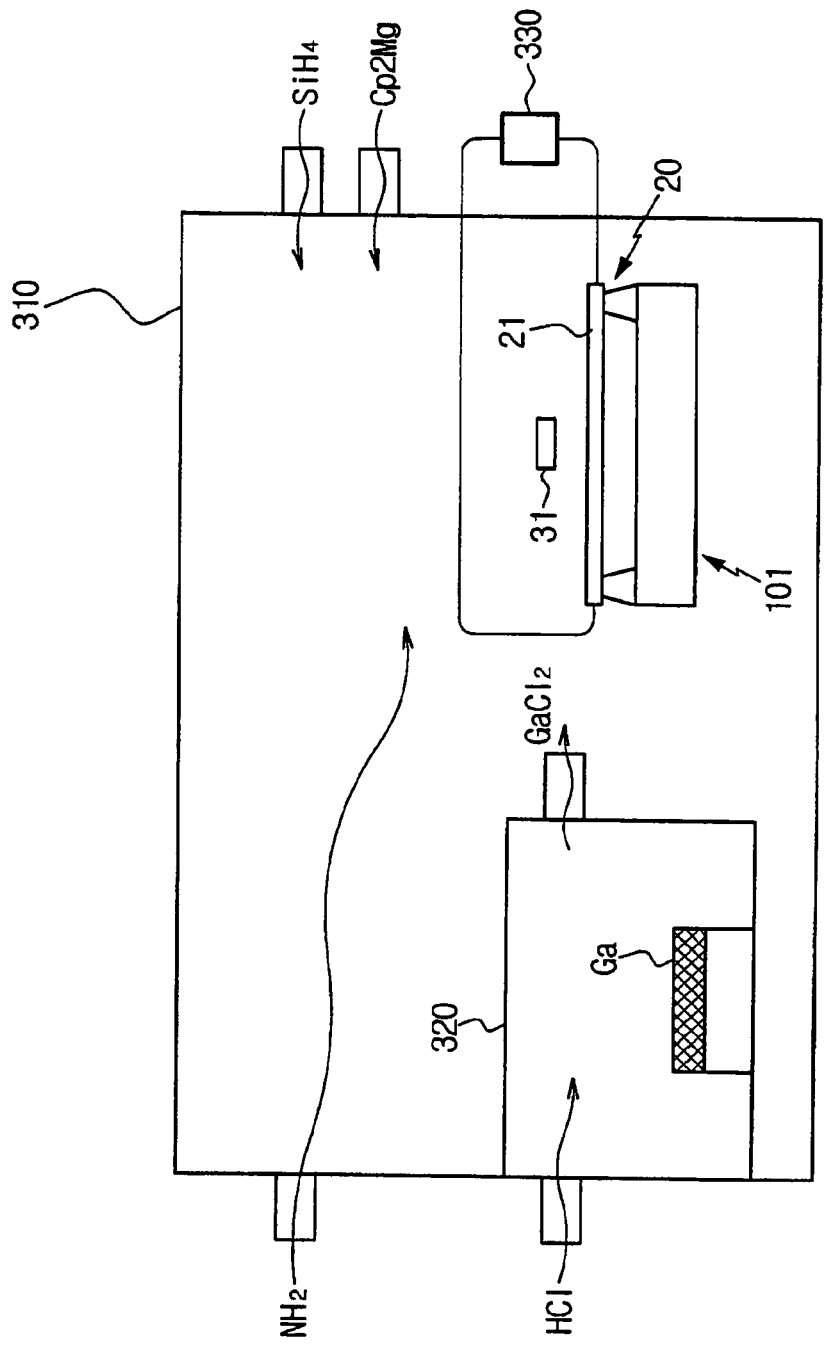

FIG. 10 illustrates a method of forming pn junctions of GaN through a halide vapor phase epitaxy (HVPE) process using the micro-heater array according to example embodiments, in which the micro-heater array illustrated in FIG. 1A is briefly shown for convenience of illustration. Referring to FIG. 10, a reactor 320 having Ga seated therein and a micro-heater array 101 according to example embodiments may be provided in a chamber 310. A quartz tube may be used as the chamber 310, and supply tubes through which hydrochloric acid (HCl), $NH_3$, $SiH_4$ and bis cyclopentadienylmagnesium ($Cp_2Mg$) may be respectively supplied into the chamber 310 and may be connected to the outside of the chamber 310.

HCl may be supplied into the reactor 320 and then reacted with metallic Ga at a temperature of about 600 to 900° C., e.g., at 800° C., to obtain gallium chloride ($GaCl_2$) that may be a source of Ga. The first heating portion 21 may be heated by applying a voltage to the first micro-heater 20 from a power supply 330 provided outside of the chamber 310. A p-type GaN layer may be formed on the first heating portion 21 by injecting $NH_3$ as a source of N and $Cp_2Mg$ as a p-type doping gas into the chamber 310.

An n-type GaN layer may be formed between the p-type GaN layer and the second heating portion 31 by injecting $NH_3$ as a source of N and $SiH_4$ as an n-type doping gas into the chamber 310 while maintaining the heating state of the first heating portion 21. Pn-junctions of GaN may be formed between the first and second heating portions 21 and 31. The first heating portion 21 may be heated at a relatively high temperature while maintaining the temperature of the substrate 10 at about 80° C., allowing the pn-junction GaN to be formed on a glass substrate.

Figure 11A:
FIGS. 11A through 11C are photographs showing poly-GaN formed through the HVPE process using the micro-heater arrays according to example embodiments.
Figure 11B:
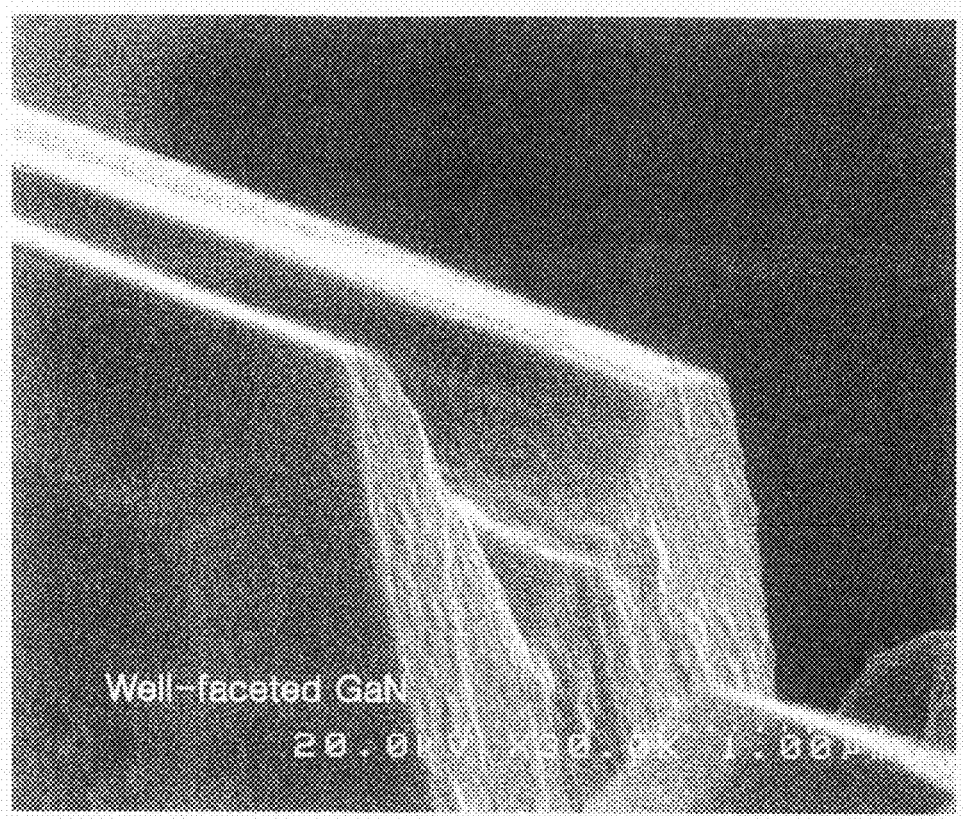
Figure 11C:
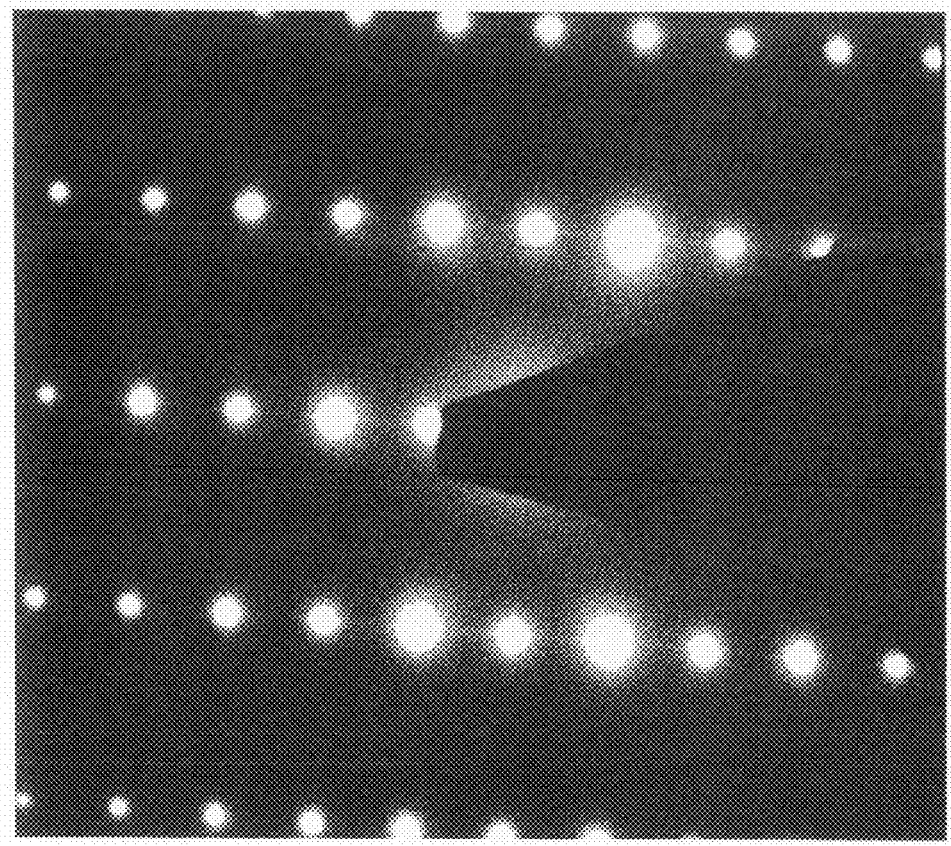

FIGS. 11A through 11C are photographs showing poly-GaN formed through an HVPE process using micro-heater arrays according to example embodiments. For example, when GaN is formed using an HVPE method, the GaN may be formed on the top surface of the first heating portion 21 or the GaN may be formed on the top and bottom surfaces of the first heating portion 21, depending on process conditions. As an example, when amorphous GaN is grown on a heat-generation temperature of 550° C. for 5 minutes on the first heating portion 21, the amorphous GaN may be formed on the top surface of the first heating portion 21. The thickness of the amorphous GaN formed on a second area heated at a relatively high temperature in the first heating portion 21 may be greater than that of the amorphous GaN formed at a first area heated at relatively low temperature.

Further, when poly-GaN is grown at a temperature of 1000° C. for 8 minutes on the first heating portion 21 using an HVPE method, the poly-GaN may be seen to grow on the top and bottom surfaces of the first heating portion 21, as illustrated in FIG. 11A. FIG. 11B is a photograph showing each crystal of the poly-GaN illustrated in FIG. 11A, and FIG. 11C is a photograph showing the selected area diffraction (SAD) pattern of each of the crystals of the poly-GaN. As illustrated in FIG. 11C, each of the crystals of the poly-GaN is a single crystal.

Figure 12:
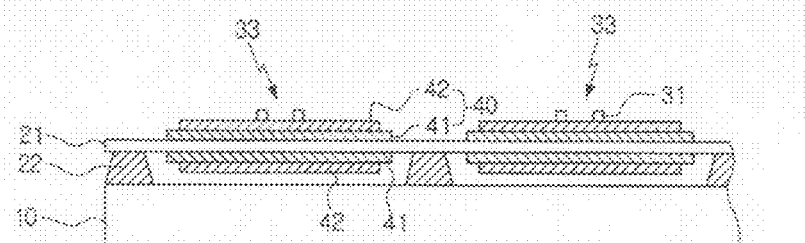

FIG. 12 is a cross-sectional view taken along line II-II' of FIG. 5. As illustrated in FIG. 12, the pn junction may be fabricated by the p-type and n-type material layers 41 and 42 formed between the first and second heating portions 21 and 31. When a forward bias is applied to the first heating portion 21 in contact with the p-type material layer 41 and the second heating portion 31 in contact with the n-type material layer 42, light may be emitted from the pn junction 40. Thus, electronic devices, e.g., LEDs and photo diodes, may be implemented using the micro-heater array and the pn junction 40 according to example embodiments. In order to emit light generated from the pn junction 40, the opening 33 may be formed in the second heating portion 31 as illustrated in FIG. 12, or the second heating portion 31 may be formed of a transparent electrode material.

In addition, LEDs using the micro-heater arrays and the pn junctions according to example embodiments may be applied to electronic devices, e.g., displays, as LED surface light sources. Additionally, the p-type and n-type material layers 41 and 42 may be grown directly on the first and second heating portions 21 and 31, using the first and second heating portions 21 and 31 as electrodes for applying a voltage to the pn junction 40 after forming the pn junction 40. Thus, there may be no need to provide a separate electrode layer to manufacture thin light displays. The micro-heater arrays and the pn junctions according to example embodiments may be used for solar cells as well. In solar cells, light may be provided to the pn junction 40 through the opening 33 of the second heating portion 31. Accordingly, the micro-heater arrays and the pn junctions fabricated using the micro-heater arrays according to example embodiments may be used in various electronic devices including pn junctions.

Figure 13A:
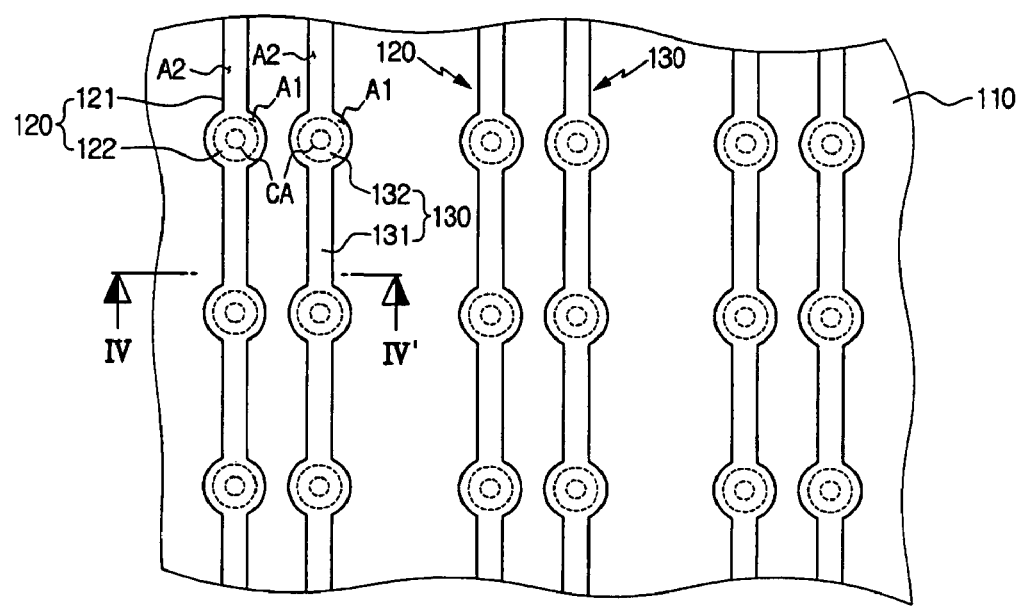
FIG. 13A is a plan view of a micro-heater array according to example embodiments.
Figure 13B:
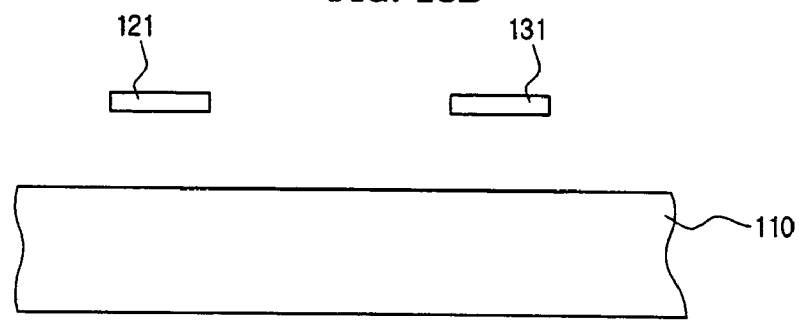
FIG. 13B is a cross-sectional view taken along line IV-IV' of FIG. 13A.

FIGS. 13A through 13D are views illustrating another method of fabricating a pn junction according to example embodiments. FIG. 13A is a plan view of a micro-heater array according to example embodiments and FIG. 13B is a cross-sectional view taken along line IV-IV' of FIG. 13A. Referring to FIGS. 13A and 13B, a micro-heater array 111 may include a substrate 110 and first and second micro-heaters 120 and 130 alternately arranged in parallel with each other.

The first micro-heater 120 may include a first heating portion 121 and first supports 122. The first heating portion 121 may be spaced apart from the substrate 110 and extend in a first direction. The first supports 122 may be partially provided between the substrate 110 and the first heating portion 121 to support the first heating portion 121.

The second micro-heater 130 may include a second heating portion 131 and second supports 132, similar to the first micro-heater 120. The second heating portion 131 may be spaced apart from the substrate 110 and provided in parallel with the first heating portion 121. The second supports 132 may be partially provided between the substrate 110 and the second heating portion 131 to support the second heating portion 131.

Each of the first and second heating portions 121 and 131 may be divided into first areas A1 and second areas A2. The first areas A1 may correspond to contact areas CA at which the first and second heating portions 121 and 131 may be respectively in contact with the first and second supports 122 and 132, and each of the second areas A2 may be positioned between the first areas A1. Relatively high-temperature heat may be generated at the second areas A2 rather than at the first areas of the first and second heating portions 121 and 131.

As illustrated in FIGS. 13A and 13B, the first and second micro-heaters 120 and 130 may be disposed in parallel with each other, so that the first and second areas A1 and A2 of the first heating portion 121 are adjacent to the first and second areas A1 and A2 of the second heating portion 131, respectively. The first and second heating portions 121 and 131 may have the same shape and structure as those of the first heating portion 21 illustrated in FIGS. 1A and 1B. Therefore, detailed descriptions of the first and second heating portions 121 and 131 will be omitted.

Figure 13C:
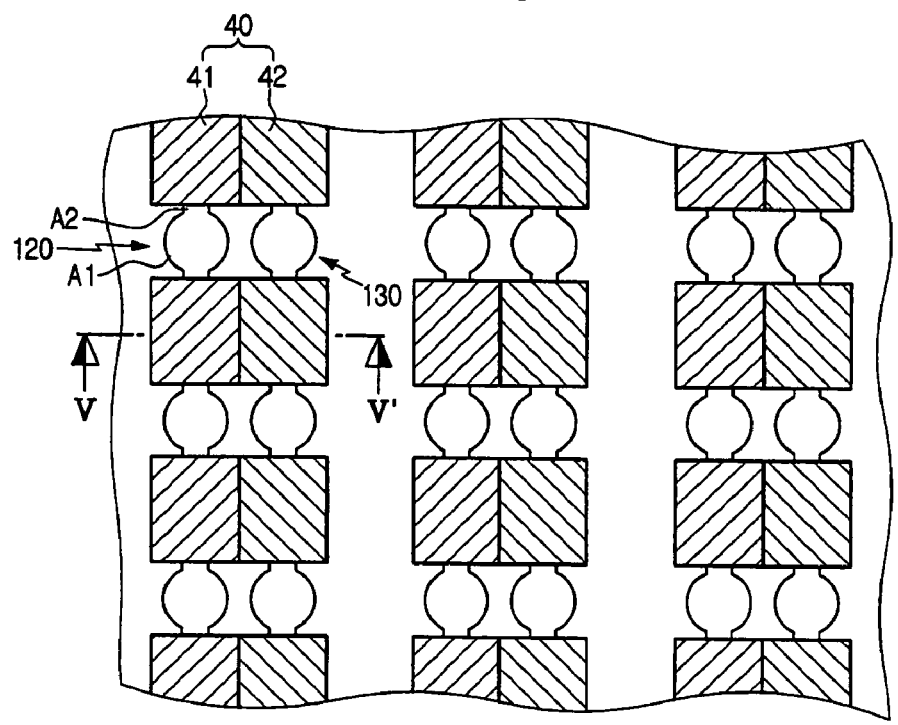
FIG. 13C is a plan view illustrating a pn junction formed between first and second heating portions using the micro-heater array illustrated in FIGS. 13A and 13B.
Figure 13D:
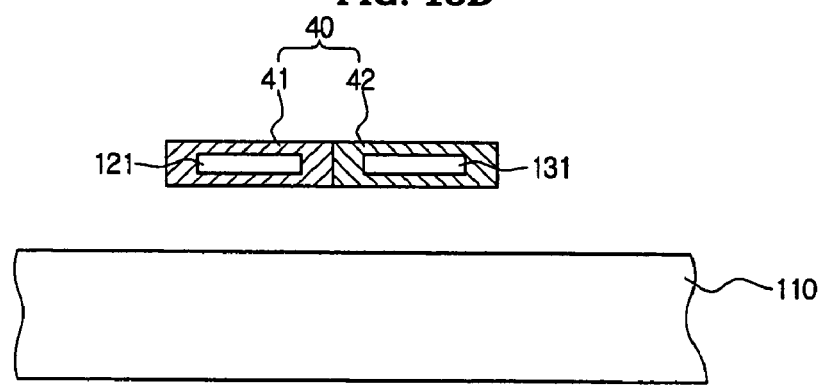
FIG. 13D is a cross-sectional view taken along line V-V' of FIG. 13C.

FIG. 13C is a plan view illustrating a pn junction formed between first and second heating portions using the micro-heater array illustrated in FIGS. 13A and 13B, and FIG. 13D is a cross-sectional view taken along line V-V' of FIG. 13C. As illustrated in FIGS. 13C and 13D, a pn junction 40 may be formed between the first and second heating portions 121 and 131 by respectively forming p-type and n-type material layers 41 and 42 on the first and second heating portions 121 and 131 using the heat generated from the first and second heating portions 121 and 131 when a voltage is applied to the micro-heater array 111.

As illustrated in FIG. 6, a pn junction may be fabricated using an MOCVD method. Instead of the micro-heater array 101 illustrated in FIG. 6, the micro-heater array 111 may be provided in a chamber (not shown). The first heating portion 121 may be heated at a relatively high temperature by applying a voltage to the first micro-heater 120. A p-type material layer 41 may be grown on the first heating portion 121 by injecting a source gas and a p-type doping gas into the chamber. The voltage application to the first micro-heater 120 may be stopped and the second heating portion 131 may be heated at a relatively high-temperature by applying a voltage to the second micro-heater 130. An n-type material layer 42 in contact with the p-type material layer 41 may be grown on the second heating portion 131 by injecting a source gas and an n-type doping gas into the chamber.

As the relatively high-temperature heat is generated at the second areas A2 of the respective first and second heating portions 121 and 131, the p-type material layer 41 may be formed at each of the second areas A2 of the first heating portion 121 and the n-type material layer 42 may be formed at each of the second areas A2 of the second heating portion 131. In the forming process of the respective p-type and n-type material layers 41 and 42, the p-type and n-type material layers 41 and 42 may be grown between the adjacent first and second heating portions 121 and 131 by controlling heating temperature, growth time, etc., resulting in a pn junction fabricated between the first and second heating portions 121 and 131. After forming the pn junction 40, the p-type and n-type material layers 41 and 42 may be subjected to post-heat treatment by applying a voltage to one or more of the first and second heating portions 121 and 131.

As the p-type and n-type material layers 41 and 42 may be grown directly on the first and second heating portions 121 and 131, light may be emitted from the pn junction 40 by applying a forward bias to the first and second heating portions 121 and 131 after fabricating the pn junction 40. Accordingly, electronic devices, e.g., LEDs, may be implemented using the micro-heater array 111 and the pn junction 40 formed using the micro-heater array 111 according to example embodiments.

The micro-heater arrays according to example embodiments may be advantageous for large size applications requiring pn junctions over a large area. In addition, example embodiments include the temperature of the substrates remaining relatively near a low and/or normal temperature when fabricating pn junctions, allowing the pn junctions to be fabricated on a glass substrate, a plastic substrate, etc. For example, according to example embodiments LEDs using GaN pn junctions may be implemented on glass, which may be a basis, e.g., for systems on glass (SOG) and systems on plastic (SOP).

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A micro-heater array comprising:
   a substrate;
   at least one first micro-heater in parallel in a first direction on the substrate; and
   at least one second micro-heater in parallel in a second direction,
   wherein each of the at least one first micro-heaters comprise, a first heating portion on the substrate extending in the first direction and first supports on the substrate to support the first heating portion, and
   each of the at least one second micro-heaters comprise, a second heating portion extending in the second direction and second supports on the substrate to support the second heating portion,
   wherein the at least one first micro-heaters are coplanar with each other and the at least one second micro-heaters are coplanar with each other but the first and second micro-heaters are not coplanar with each other.

2. The micro-heater array according to claim 1, wherein the first direction is perpendicular to the second direction and the at least one first micro-heater intersects the at least one second micro-heater.

3. The micro-heater array according to claim 2, wherein each of the first and second heating portions further includes:
   first areas corresponding to contact areas where the first and second heating portions contact the first and second supports, respectively; and
   second areas between the first areas.

4. The micro-heater array according to claim 1, wherein the first direction is the same as the second direction.

5. A micro-heater array comprising:
   a substrate;
   at least one first micro-heater in parallel in a first direction on the substrate;
   at least one second micro-heater in parallel in a second direction,
   wherein each of the at least one first micro-heaters comprise, a first heating portion on the substrate extending in the first direction and first supports on the substrate to support the first heating portion, wherein each of the at least one second micro-heaters comprise, a second heating portion extending in the second direction and second supports on the substrate to support the second heating portion, wherein the first heating portion intersects the second heating portion.

6. A micro-heater array comprising:
a substrate;
at least one first micro-heater in parallel in a first direction on the substrate; and
at least one second micro-heater in parallel in a second direction,
wherein each of the at least one first micro-heaters comprise, a first heating portion on the substrate extending in the first direction and first supports on the substrate to support the first heating portion,
wherein each of the at least one second micro-heaters comprise, a second heating portion extending in the second direction and second supports on the substrate to support the second heating portion,
wherein a space between the first heating portion and the substrate is smaller than a space between the second heating portion and the substrate, at an intersection area thereof.

7. The micro-heater array according to claim 6, wherein the second heating portion has an opening at the intersection area of the first and second heating portions.

8. The micro-heater array according to claim 6, wherein the second heating portion includes a transparent electrode.

9. The micro-heater array according to claim 6, wherein the first supports are between the substrate and the first heating portion and the second supports are between the substrate and the second heating portion, except at the intersection area.

10. The micro-heater array according to claim 6, further including:
first connecting portions extending from two sides of the first heating portion of the at least one first micro-heater along a longitudinal direction of the first heating portion, respectively, except at the intersection area; and
second connecting portions extending from two sides of the second heating portion of the at least one second micro-heater along a longitudinal direction of the second heating portion, respectively, except at the intersection area,
wherein the first supports are between the substrate and the first connecting portions to support the first heating portion and the first connecting portions, and the second supports are between the substrate and the second connecting portions to support the second heating portion and the second connecting portions.

11. The micro-heater array according to claim 6, further including:
first connecting portions extending from two sides of the first heating portion of the at least one first micro-heater along a longitudinal direction of the first heating portion, respectively, except at the intersection area,
wherein the first supports are between the substrate and the first connecting portions to support the first heating portion and the first connecting portions, and the second supports are between the substrate and the second connecting portions to support the second heating portion and the second connecting portions.

12. The micro-heater array according to claim 6, further including:
second connecting portions extending from two sides of the second heating portion of the at least one second micro-heater along a longitudinal direction of the second heating portion, respectively, except at the intersection area,
wherein the second supports are between the substrate and the second connecting portions to support the second heating portion and the second connecting portions, and the first supports are between the substrate and the first heating portion to support the first heating portion.

13. The micro-heater array according to claim 6, wherein the at least one first and second micro-heaters are driven independently.

14. A method for fabricating a pn junction comprising:
providing a micro-heater array, the providing of the micro-heater array including,
providing a substrate,
forming at least one first micro-heater in parallel in a first direction on the substrate,
forming at least one second micro-heater in parallel in a second direction on the substrate,
wherein the forming of each of the at least one first micro-heaters includes forming a first heating portion on the substrate that extends in the first direction and forming first supports on the substrate to support the first heating portion,
wherein the forming of each of the at least one second micro-heaters includes forming a second heating portion on the substrate that extends in the second direction and forming second supports on the substrate to support the second heating portion; and
forming a pn junction between the first and second heating portions by applying a voltage to the micro-heater array.

15. The method according to claim 14, wherein the first direction is perpendicular to the second direction, and the at least one first micro-heater intersects the at least one second micro-heater.

16. The method according to claim 15, further including:
providing the micro-heater array in a chamber;
applying a voltage to at least one of the at least one first and second micro-heaters;
injecting a source gas and a p-type doping gas into the chamber;
growing a p-type material layer on at least one of the first or second heating portion;
injecting a source gas and an n-type doping gas into the chamber; and
growing an n-type material layer on the p-type material layer.

17. The method according to claim 16, further including;
forming at least one of a catalyst layer and a buffer layer on at least one of the first and second heating portions.

18. The method according to claim 16, further including;
forming an $In_xGa_{1-x}N$ layer between the p-type and n-type material layers.

19. The method according to claim 16, further including;
applying a voltage to at least one of the first and second heating portions to heat the p-type and n-type material layers.

20. The method according to claim 14, wherein the first direction is the same as the second direction and the at least first and second micro-heaters are alternately arranged.

21. The method according to claim 20, wherein forming the pn junction further includes:
forming p-type and n-type material layers on the first and second heating portions, respectively.

22. The method according to claim 21, further including,
providing the micro-heater array in a vacuum chamber;
applying a voltage to the at least one first micro-heater;

injecting a source gas and a p-type doping gas into the chamber;

growing a p-type material layer on the first heating portion;

applying a voltage to the at least one second micro-heater;

injecting a source gas and an n-type doping gas into the chamber; and growing an n-type material layer in contact with the p-type material layer on the second heating portion.

23. The method according to claim 22, wherein the at least one first and second micro-heaters are alternately arranged.

24. The method according to claim 23, further including, dividing each of the first and second heating portions into first areas corresponding to contact areas where the first and second heating portions contact the first and second supports, respectively, and second areas between the first areas;

forming the p-type material layer on each of the second areas of the first heating portion; and forming the n-type material layer on each of the second areas of the second heating portion.

25. The method according to claim 24, further including, applying a voltage to at least one of the first and second heating portions to heat the p-type and n-type material layers.

26. A pn-junction device comprising:
a micro-heater array, the micro-heater array including,
   a substrate;
   at least one first micro-heater in parallel in a first direction on the substrate; and
   at least one second micro-heater in parallel in a second direction,
   wherein each of the at least one first micro-heaters comprise, a first heating portion on the substrate extending in the first direction and first supports on the substrate to support the first heating portion, and
   each of the at least one second micro-heaters comprise, a second heating portion extending in the second direction and second supports on the substrate to support the second heating portion; and
at least one pn junction between the at least one first and second micro-heaters, wherein the at least one pn junction includes p-type and n-type material layers between the at least one first and second heating portions.

27. The pn-junction device according to claim 26, wherein the first direction is perpendicular to the second direction and the at least one first micro-heater intersects the at least one second micro-heater.

28. The pn-junction device according to claim 27, wherein the first and second heating portions are used as electrodes for applying a voltage to the p-type and n-type material layers, respectively.

29. The pn-junction device according to claim 26, wherein the first direction is the same as the second direction.

30. The pn-junction device according to claim 29, wherein the first and second heating portions are used as electrodes for applying a voltage to the p-type and n-type material layers, respectively.

31. A micro-heater array comprising:
a substrate;
at least one first micro-heater in parallel in a first direction on the substrate; and
at least one second micro-heater in parallel in a second direction,
wherein each of the at least one first micro-heaters comprise, a first heating portion on the substrate extending in the first direction and first supports on the substrate to support the first heating portion, and
each of the at least one second micro-heaters comprise, a second heating portion extending in the second direction and second supports on the substrate to support the second heating portion,
wherein the first and second micro-heaters are supported by discrete support portions or pedestals.

* * * * *